(12) United States Patent
Fang et al.

(10) Patent No.: US 8,669,597 B2
(45) Date of Patent: Mar. 11, 2014

(54) MEMORY DEVICE INTERCONNECTS AND METHOD OF MANUFACTURING

(75) Inventors: Shenqing Fang, Fremont, CA (US); Connie Wang, Mountain View, CA (US); Wen Yu, Fremont, CA (US); Fei Wang, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 464 days.

(21) Appl. No.: 12/116,200

(22) Filed: May 6, 2008

(65) Prior Publication Data

US 2009/0278173 A1 Nov. 12, 2009

(51) Int. Cl.
*H01L 29/66* (2006.01)
*H01L 21/4763* (2006.01)

(52) U.S. Cl.
USPC .......................................... 257/211; 438/622

(58) Field of Classification Search
USPC .................. 257/211, 235, 260, 390, E27.009, 257/E27.075, E27.078, E27.085, E27.098, 257/E25.002, E21.661, E21.662, 903, 774; 438/FOR. 189, FOR. 212, 640
See application file for complete search history.

(56) References Cited

U.S. PATENT DOCUMENTS

| | | | | |
|---|---|---|---|---|
| 5,289,423 | A * | 2/1994 | Natale et al. | 365/185.12 |
| 6,744,096 | B2 * | 6/2004 | Lee et al. | 257/316 |
| 7,433,231 | B2 * | 10/2008 | Aritome | 365/185.17 |
| 2002/0173096 | A1 * | 11/2002 | Okudaira | 438/253 |
| 2003/0148600 | A1 * | 8/2003 | Furukawa et al. | 438/622 |
| 2005/0280120 | A1 * | 12/2005 | Tomita | 257/620 |
| 2006/0214218 | A1 * | 9/2006 | Shishido et al. | 257/315 |
| 2007/0007658 | A1 * | 1/2007 | Tomita et al. | 257/758 |
| 2007/0102824 | A1 * | 5/2007 | Chun | 257/774 |
| 2007/0138536 | A1 * | 6/2007 | Arai et al. | 257/315 |
| 2008/0079091 | A1 * | 4/2008 | Park et al. | 257/390 |
| 2009/0034323 | A1 * | 2/2009 | Lung et al. | 365/163 |
| 2009/0035907 | A1 * | 2/2009 | Ikeda | 438/266 |

\* cited by examiner

*Primary Examiner* — Matthew W Such
*Assistant Examiner* — Robert Carpenter

(57) ABSTRACT

An integrated circuit memory device, in one embodiment, includes a substrate having a plurality of bit lines. A first and second inter-level dielectric layer are successively disposed on the substrate. Each of a plurality of source lines and staggered bit line contacts extend through the first inter-level dielectric layer. Each of a plurality of source line vias and a plurality of staggered bit line vias extend through the second inter-level dielectric layer to each respective one of the plurality of source lines and the plurality of staggered bit line contacts. The source lines and staggered bit line contacts that extend through the first inter-level dielectric layer are formed together by a first set of fabrication processes. The source line vias and staggered bit line contacts that extend through the second inter-level dielectric layer are also formed together by a second set of fabrication processes.

19 Claims, 27 Drawing Sheets

MEMORY DEVICE INTERCONNECTS AND METHOD OF MANUFACTURING

BACKGROUND OF THE INVENTION

There is a continuing need for improved flash memory devices. The need for larger storage capacity devices, faster operating devices and/or lower power consuming devices continually drive further scaling of memory devices. However, the scaling of memory devices is constrained by design rules that are technology specific. The design rules specify the minimum feature sizes, spacings and overlaps for the component devices and interconnects, and the maximum misalignment that can occur between two masks. In addition, line width expansion and shrinkage throughout fabrication also strongly affect the design rules.

Referring to FIG. 1, a representation of a memory cell array, according to the conventional art, is shown. The representation illustrates the grid of word lines 110, bit lines 120, drain select gate, source select gate, source line, and corresponding contacts. In the conventional art, the bit line interconnects may include polysilicon plugs (Poly 3), tungsten (W) clad layers, tungsten vias, and M1 interconnects. The source line interconnects may include polysilicon layer buried contacts (Poly 3), Titanium nitride (TiN) barrier layers, and tungsten (W) damascene M1 interconnects. The conventional interconnects require a relatively large number of masks. In addition, the bit line interconnects and source line interconnects are typically fabricated separately. Furthermore, the polysilicon portions of the conventional interconnects are characterized by a relatively high resistance.

In order to continue to scale memory devices, such as NAND flash memories, there is a continuing need to further scale the interconnects. Preferably, the interconnects should be fabricated using as few masks as possible. The resistance of interconnects should also preferably be lower than conventional bit line and source line ground interconnects.

SUMMARY OF THE INVENTION

Embodiments of the present technology are directed toward integrated circuit IC memory devices having staggered bit line contacts. The bit line contacts, bit line vias, the source lines and source line vias of the IC memory device are also substantially fabricated together. In addition, the bit line contacts, bit line vias, source lines and source line vias of the IC memory device are metal or a metal alloy.

In one embodiment, the integrated circuit memory device includes a substrate having a plurality of bit lines. A first inter-level dielectric layer is disposed on the substrate and a second inter-level dielectric layer is disposed on the first inter-level dielectric layer. A plurality of source lines extend through the first inter-level dielectric layer to the plurality of bit lines. Source line vias extend through the second inter-level dielectric layer to the source lines. Each of a plurality of staggered bit line contacts extend through the first inter-level dielectric layers to a respective one of the plurality of bit lines. Each of a plurality of bit line vias extend through the second inter-level dielectric layer to a respective one of the plurality of staggered bit line contacts. A metallization layer is coupled to one or more of the plurality of source line vias and one or more of the plurality of staggered bit line vias.

In another embodiment, a method of fabricating the integrated circuit memory device includes depositing a first inter-level dielectric layer on a substrate having a plurality of bit lines. A plurality of source line trenches are etched in the first inter-level dielectric layer and a plurality of staggered bit line contact openings are etched in the first inter-level dielectric layer such that each opening extends to a respective one of the plurality of bit lines. A plurality of source lines are formed in the plurality of source line trenches and a plurality of staggered bit line contacts are formed in the plurality of staggered bit line contact openings from a first metal layer. A second inter-level dielectric layer is then deposited on the first inter-level dielectric layer. A plurality of source line via openings are etched in the second inter-level dielectric layer such that each opening extends to a source line. In addition, a plurality of staggered bit line via openings are etched in the second inter-level dielectric layer such that each opening extends to a respective one of the plurality of staggered bit line contacts. A plurality of source line vias are formed in the plurality of source line via openings and a plurality of staggered bit line vias are formed in the plurality of staggered bit line via openings from a second metal layer.

In yet another embodiment, a method of fabricating an integrated circuit memory device includes depositing a first inter-level dielectric layer on a substrate having a plurality of bit lines. A plurality of source line trenches are etched in the first inter-level dielectric layer. In addition, a plurality of staggered bit line contact openings are etched in the first inter-level dielectric layer such that each opening extends to a respective one of the plurality of bit line. A plurality of source lines are formed in the plurality of source line trenches and a plurality of staggered bit line contacts are formed in the plurality of staggered bit line contact openings from a first metal layer. A second inter-level dielectric layer and an etch stop layer are then deposited on the first inter-level dielectric layer. A plurality of source line via windows and a plurality of bit line via windows are etched in the etch stop layer proximate the source lines and the staggered bit line contacts respectively. A plurality of trenches are etched in the first metallization oxide layer that each extend to a respective one of the plurality of source line via windows and the plurality of staggered bit line vias windows in the etch stop layer. The etching process is continued to etch a plurality of the source line via openings through the second inter-level dielectric layer to a respective one of the plurality of the source lines, and a plurality of staggered bit line via openings through the second inter-level dielectric layer to a respective one of the first portion of the plurality of staggered bit line contacts. A plurality of source vias are the formed in the plurality of source via openings, a plurality of staggered bit line vias are formed in the plurality of staggered bit line via openings and a first metallization layer is formed in the plurality of trenches in the first metallization oxide layer from a second metal layer.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Integrated circuits such as memory devices may have hundreds, thousands, millions or more transistors, capacitors and the like, referred herein to as semiconductor components, fabricated therein. The interconnections between semiconductor components are typically made in a plurality of levels. As used here, the term "line" and "lines" refer to the portions of interconnects that are arranged in planes that are substantially parallel to the wafer substrate. For example, a memory device typically includes a plurality of source lines, bit lines, drain select gates, source select gates, and the like fabricated in one or more planes in the interconnect layers. The terms "contact," "contacts," "via" and "vias" refer to the portions of interconnects that are substantially perpendicular to the wafer substrate used to connect lines in different planes or provide a connect at the surface of the die to lines or components buried under one or more layers.

Embodiments of the present technology are directed to IC memory devices with staggered bit line contacts and bit line vias. The staggered bit line contacts and bit line vias may be formed at the same time as the source lines and source line vias. In addition, the source line and source line vias and/or the bit line contacts and bit line vias may be separated into two portions vertically. Furthermore, the source line, source line vias, bit line contacts and bit line vias may be metal.

Figure 1:
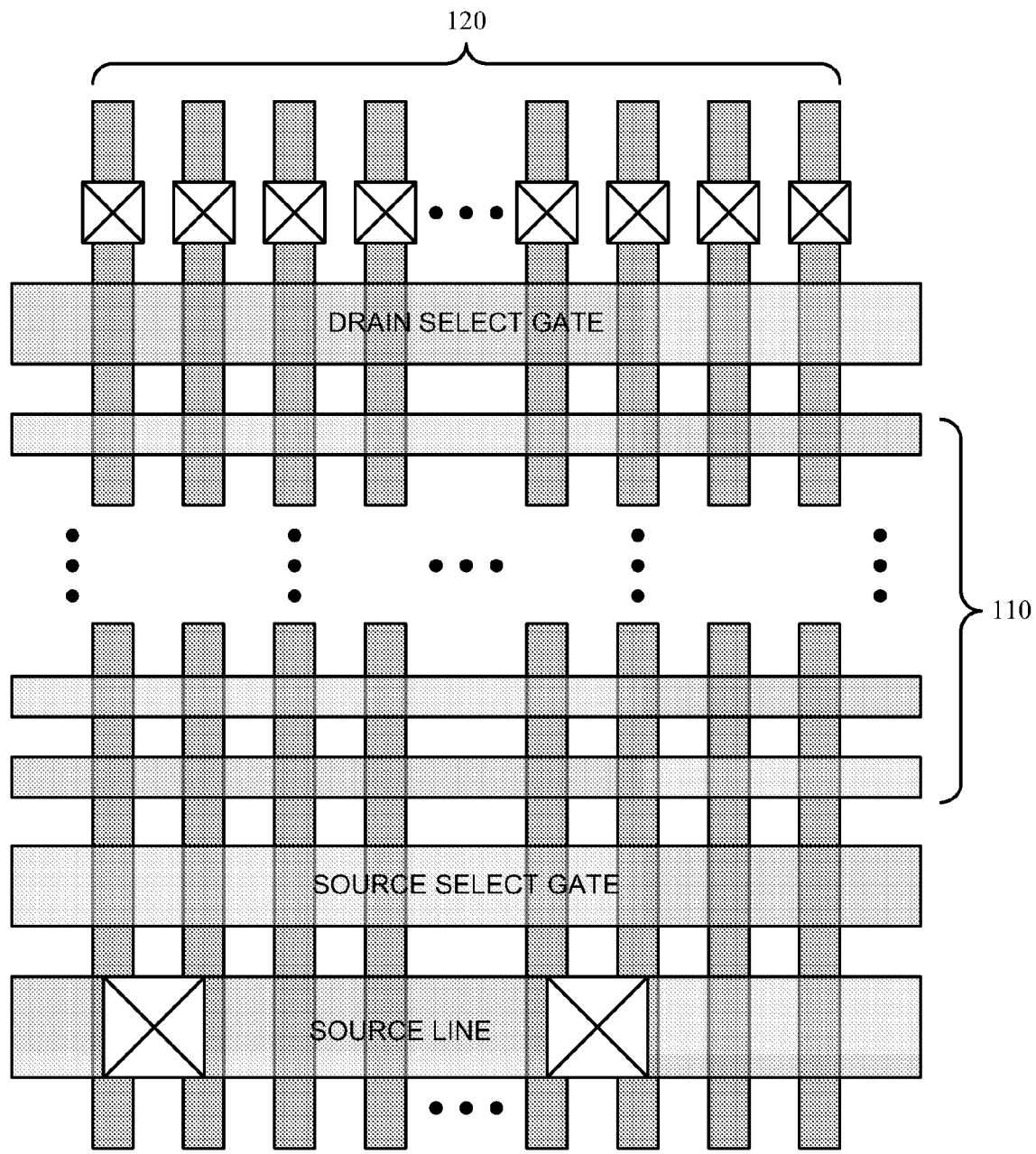
FIG. 1 shows a representation of a memory cell array, according to the conventional art.
Figure 2:
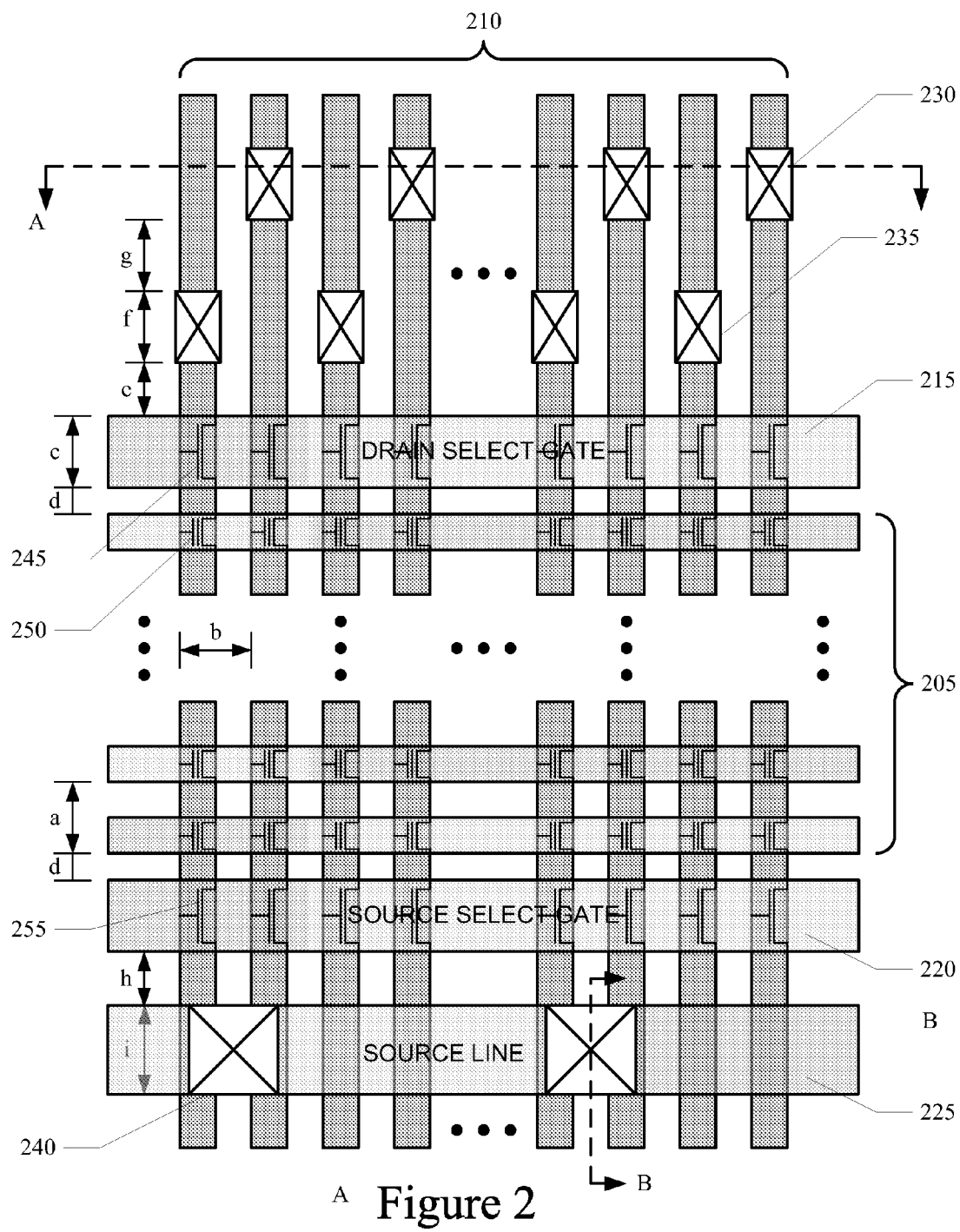
FIG. 2 shows a representation of a memory cell array, in accordance with one embodiment of the present technology.

Referring now to FIG. 2, a representation of a memory cell array, in accordance with one embodiment of the present technology, is shown. The word lines 205, bit lines 210, drain select gates 215, source select gates 220, source lines 225 and corresponding contacts/vias 230, 235, 240 of the memory cell array are shown overlaid over a symbolic representation of a NAND cell array. Each column of the NAND flash memory array includes a drain select (e.g., MOSFET transistor) 245, a plurality of flash memory cells (e.g., floating gate MOSFET or SONOS transistors) 250, and a source select (e.g., MOSFET transistor) 255 disposed along a corresponding bit line 210. A drain select gate 215 is coupled to the gates of the drain selects 245 aligned in the first row. A respective one of a plurality of word lines 205 is coupled to the gates of each of the flash memory cells 250 along a given row. A source select gate 220 is coupled to the gates of the source selects 255 aligned in the last row.

The area of the semiconductor die consumed by the core memory cell unit is a function of the word line pitch (a) and the bit line pitch (b). The rest of the area of the semiconductor die is consumed by features that are considered overhead with regard to the core memory cell unit. The overhead is a function of the select gate width (c), select gate word line space (d), select gate-bit line contact space (e), via bottom on CD in y-direction (f), space between staggered contacts (g), select gate-source line space (h), and source line width (bottom) (i). The select gate-bit line contact space (e), contact bottom CD in the y-direction (f), the space between staggered contacts (g), select gate-source line space (h) and source line width (i) are determined by process capability.

The bit line contacts/vias 230, 235 are staggered so that adjacent bit line contacts/vias are not in the same row. Staggering the bit line contacts/vias 230, 235 increases the allowable misalignment tolerance without increasing the bit line pitch. The bit line contacts/vias 230, 235, source lines 225 and source line vias 240 may be metal or metal alloy, such as tungsten, copper or the like. The metal source lines 225, source line vias 240 and bit line contacts/vias 230, 235 reduce the resistance of the source line interconnects and bit line interconnects as compared to the conventional art. In addition, the bit line contacts/vias 230, 235, source lines 225 and source line vias 240 may be formed at the same time. As a result, such NAND flash memories are characterized by improved bit line interconnects and source line interconnects.

Referring now to FIGS. 3A-3D, a method of fabricating interconnects in an integrated circuit (IC) memory device, according to one embodiment of the present technology, is shown. The method of fabricating multilevel interconnects in an IC memory device will be further illustrated with reference to FIGS. 4A-4D, which shows various stages during fabrication of the IC memory device. The left side of FIGS. 4A-4D illustrate a cross-sectional view of FIG. 2 along view line A-A and the right side of FIG. 4A-4D illustrate a cross-sectional view of FIG. 2 along view line B-B. The method of fabricating the IC memory device begins, at 302, with various initial processes upon a wafer 402, such as cleaning, depositing, oxidation, doping, diffusion, implanting, photolithography, etching, chemical vapor deposition, evaporation, sputtering, epitaxy, annealing and/or the like. The initial fabrication processes form an array of memory cells, and periphery circuits such as input/output buffers, data latch, address latch, address decoders and control logic. In one implementation, the IC memory device may be a NAND flash memory device.

At 304, a first inter-level dielectric layer (ILDOA) 404 is deposited on the wafer 402. The inter-level dielectric may be chemical-vapor-deposited or sputtered silicon dioxide (SiO2), polyimide or the like. At 306, the inter-level dielectric layer 404 is thinned and/or planarized. In one implementation, the deposited first inter-level dielectric layer is thinned and planarized by chemical-mechanical polishing (CMP). At 308, a photo-resist is deposited and patterned by any well-known lithography process to form a source line mask. At 310, a plurality of trenches 410 are etched by any well-known etching method. In one implementation, an etchant interacts with the portions of the first inter-level dielectric layer exposed by the patterned resist until a plurality of source line trenches 410 are formed. At 312, the source line mask is removed utilizing an appropriate resist stripper or a resist ashing process.

Figure 3A:
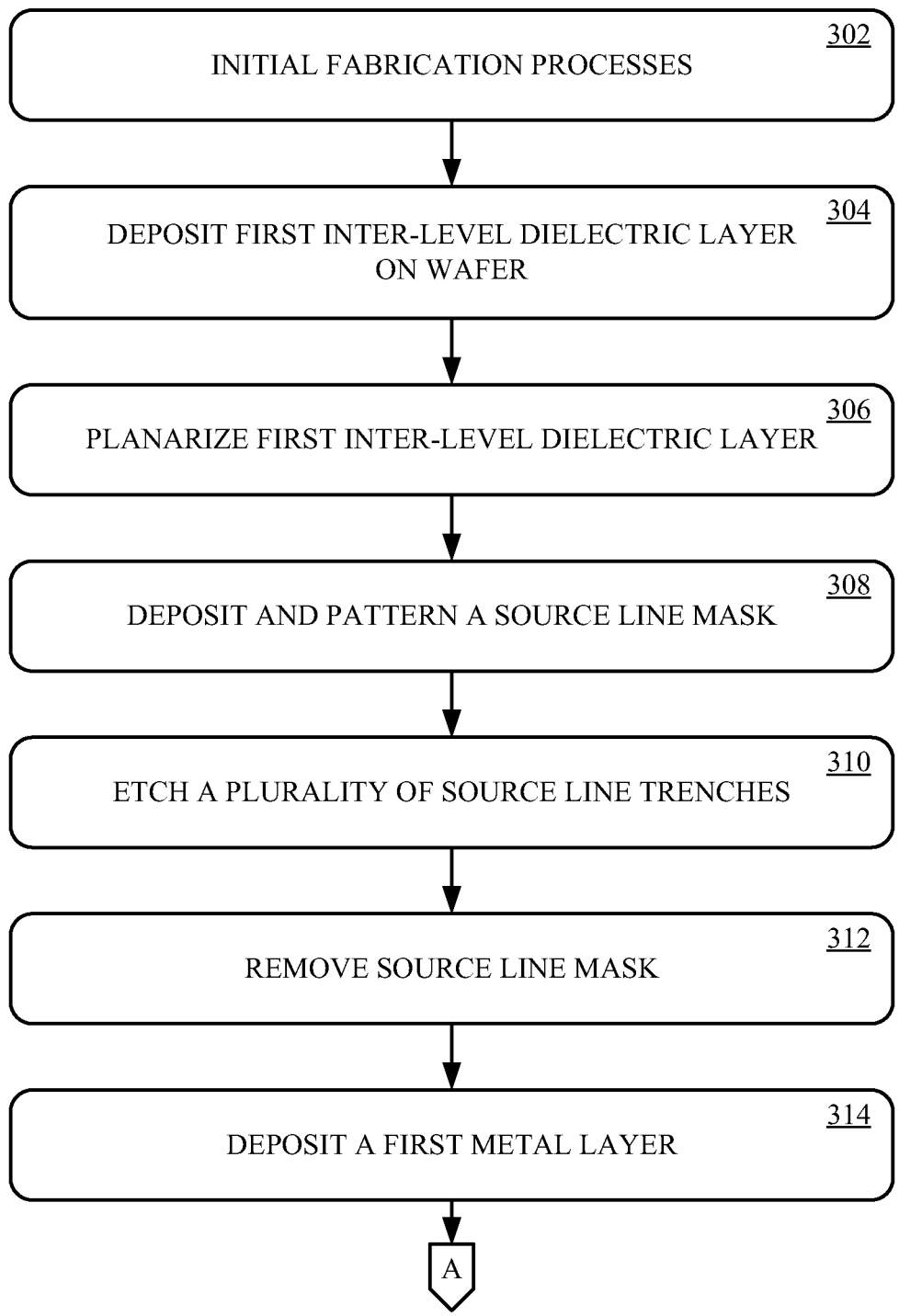
FIGS. 3A-3D show a method of fabricating interconnects in an integrated circuit (IC) memory device, according to one embodiment of the present technology.
Figure 3B:
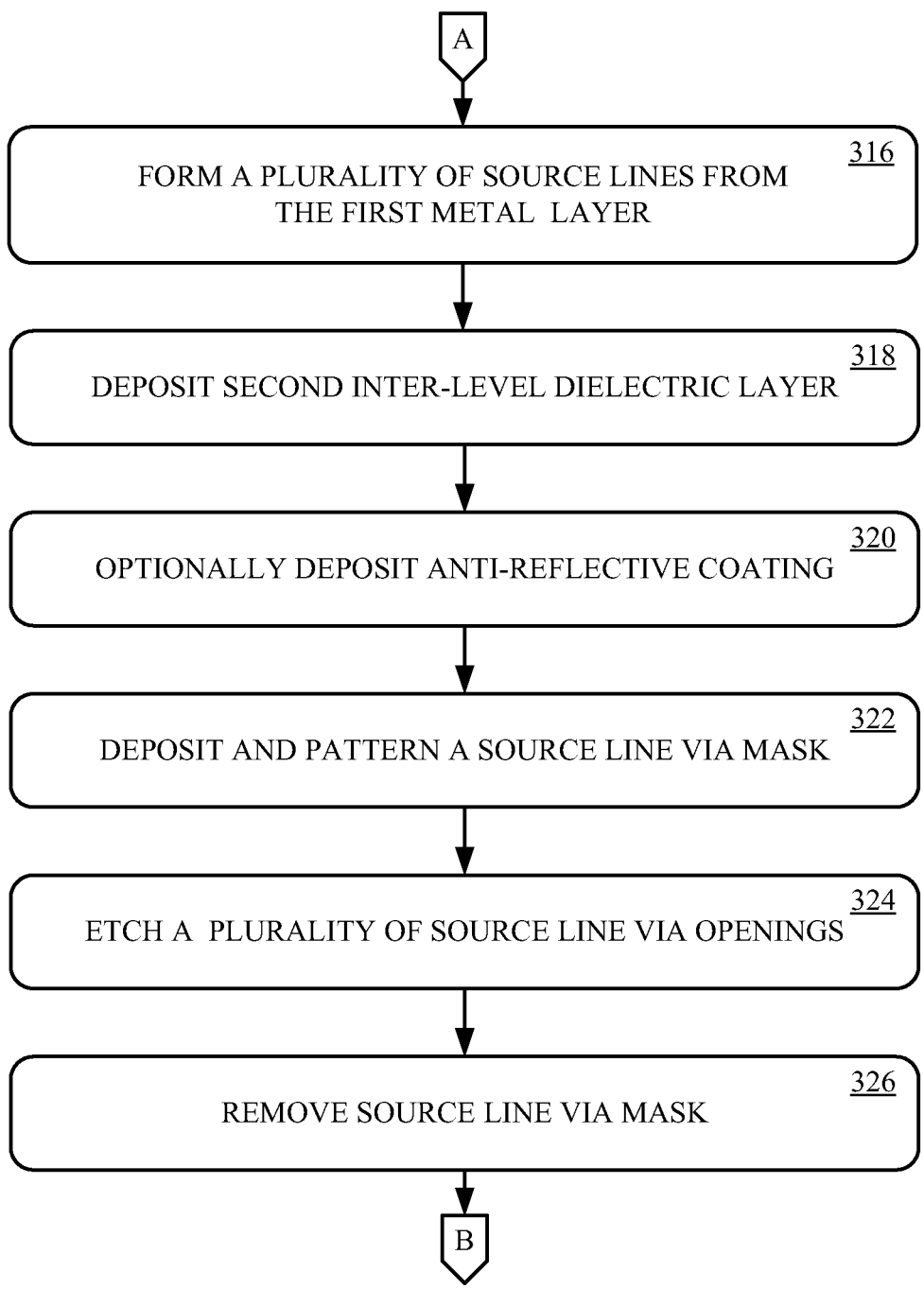

At 314, a first metal layer is deposited on the first inter-level dielectric 404. In one implementation, the metal may be titanium (Ti), titanium nitride (TiN), tungsten (W), or a multilayer metal such as Ti/TiN/W. Referring now to FIG. 3B, excess metal of the first metal layer is removed to form source lines 416 in the source line trenches 410, at 316. In one implementation, the first metal layer is chemical-mechanical polished (CMP) to form the source lines 416 in the source line trenches 410.

Figure 4A:
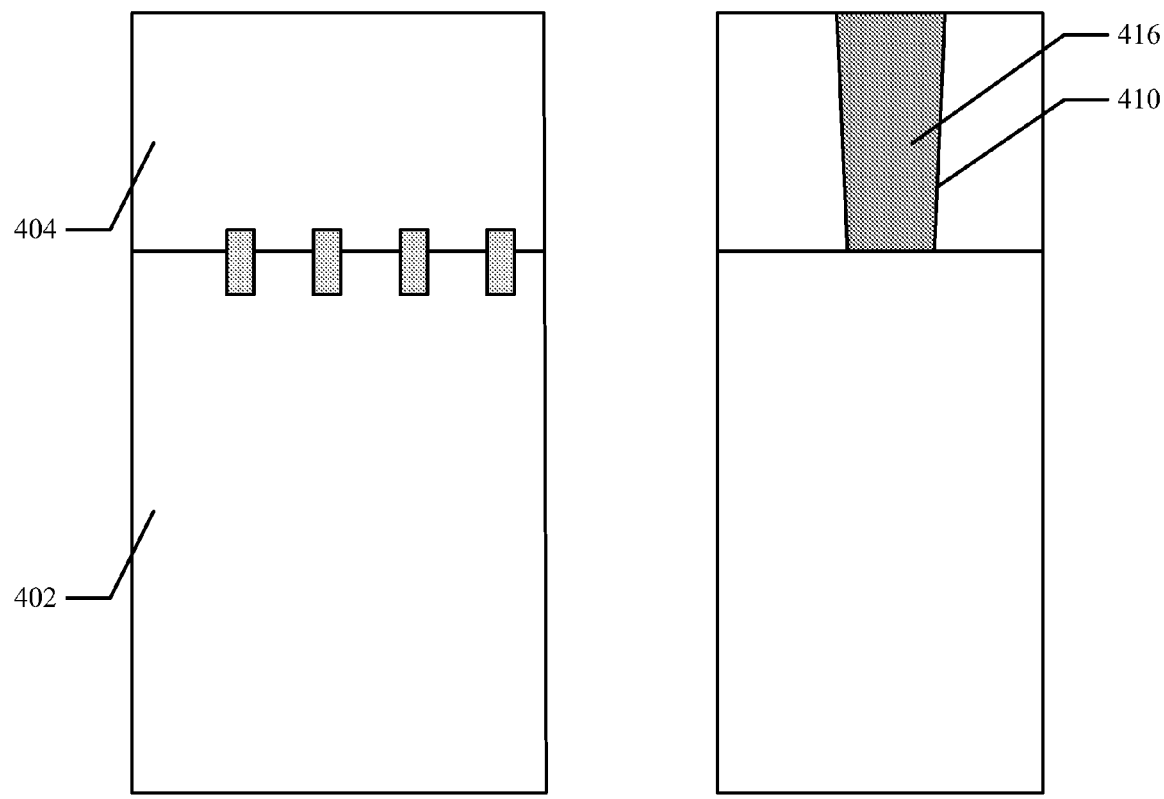
FIGS. 4A-4D shows various stages during fabrication of the IC memory device, in accordance with one embodiment of the present technology.
Figure 4B:
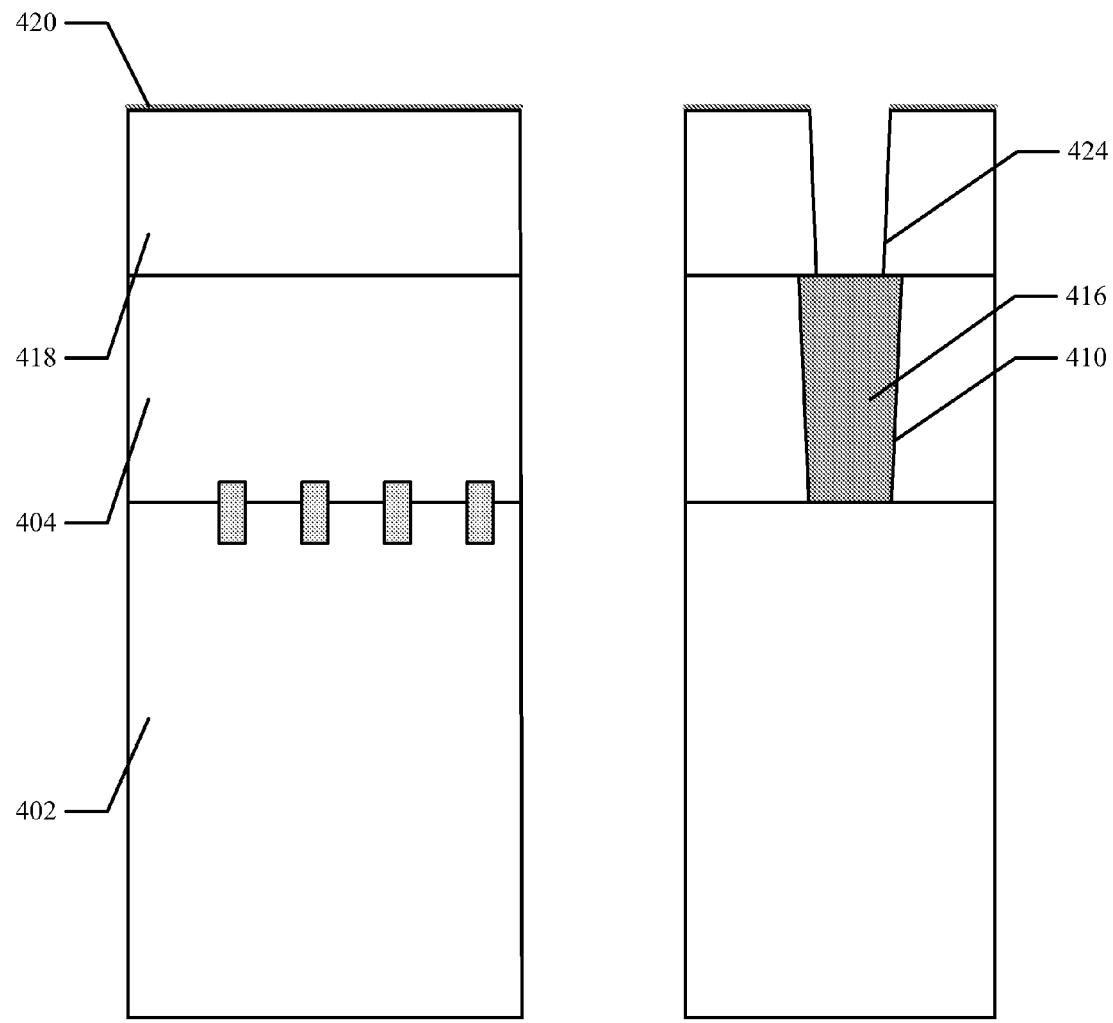

Referring now to FIG. 4B, a second inter-level dielectric layer (ILD0B) 418 is deposited, at 318. An anti-reflective coating (ARC) 420 may also be deposited, at 320. At 322, a photo-resist is deposited and patterned by any well-known lithography process to form a source line via mask. At 324, a plurality of openings are etched by any well-known etching method to form a plurality of source line via openings 424. In one implementation, an etchant removes the portions of the second inter-level dielectric layer 418 exposed by the patterned resist layer until the plurality of openings extend to the source lines 416. At 326, the source line via mask is removed utilizing an appropriate resist stripper or a resist ashing process.

Figure 3C:
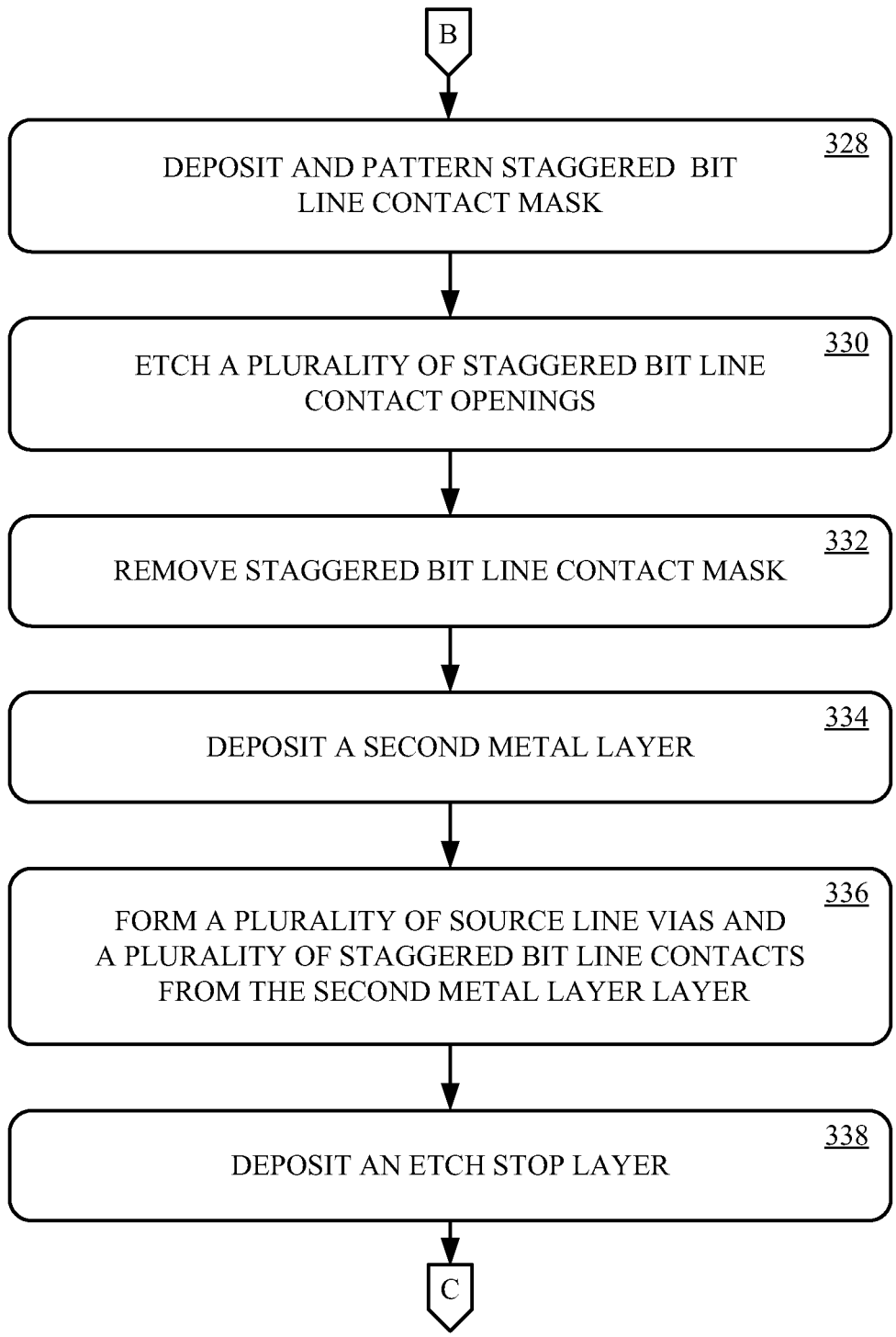
Figure 4C:
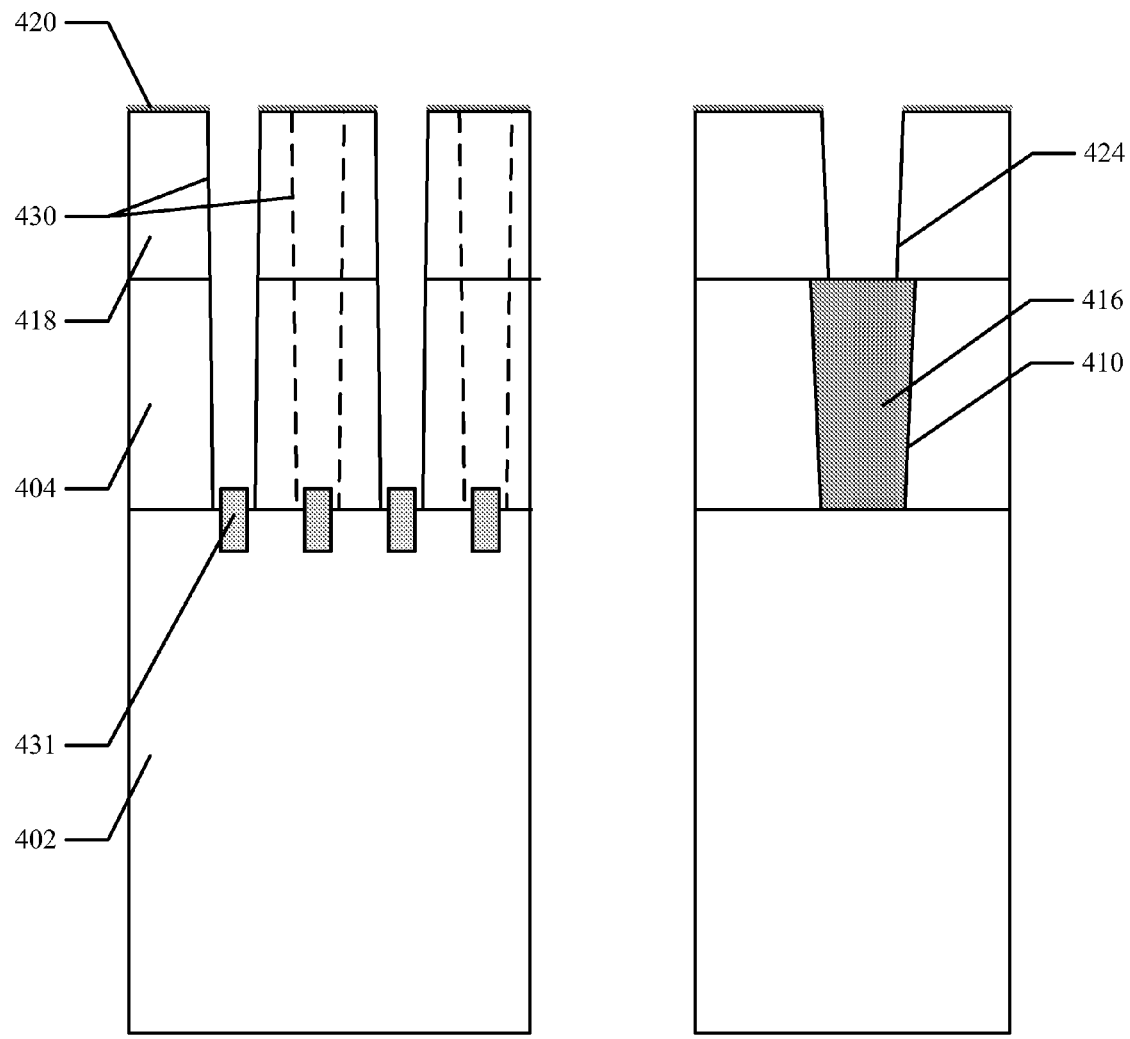

Referring now to FIG. 3C, a photo-resist is deposited and patterned by any well-known lithography process to form a staggered bit line contact mask, at 328. Referring now to FIG. 4C, a plurality of openings are etched by any well-known etching method to form a plurality of staggered bit line contact openings 430, at 330. The bit line contact openings 430 are staggered so that adjacent openings are not in the same row. In one implementation, an etchant removes the portions of the second inter-level dielectric layer 418 and first inter-level dielectric layer 404 exposed by the patterned resist layer until the plurality of staggered bit line contact openings 430 extend to respective bit lines 431. At 332, the staggered bit line contact mask is removed utilizing an appropriate resist stripper or a resist ashing process.

Figure 4D:
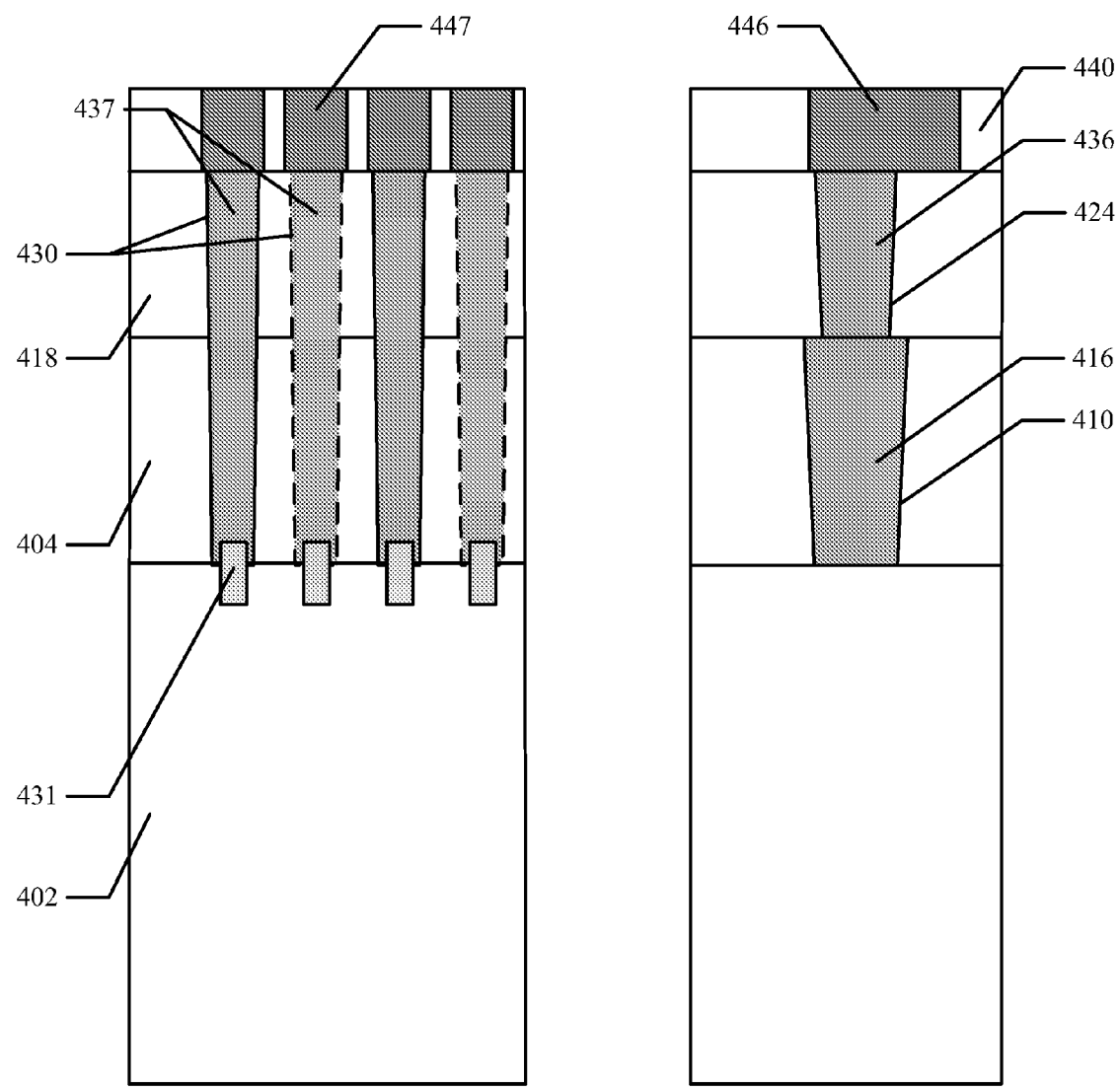

Referring now to FIG. 4D, a second metal layer is deposited on the second inter-level dielectric 418 and in the openings 424, 430, at 334. In one implementation, the metal may be titanium (Ti), titanium nitride (TiN), tungsten (W), or a multilayer metal such as Ti/TiN/W. At 336, excess metal is removed to form a plurality of source line vias 436 and a plurality of staggered bit line contacts 437 in the second portion of the source line via openings 424 and the bit line contact openings 430 respectively. In one implementation, the second metal layer is chemical-mechanical polished (CMP) to form the source line vias 436 in the source line via openings 424 and the staggered bit line contacts 437 in the staggered bit line contact openings 430. The resulting bit line contacts 437 are staggered so that adjacent bit line contacts are not in the same row.

Figure 3D:
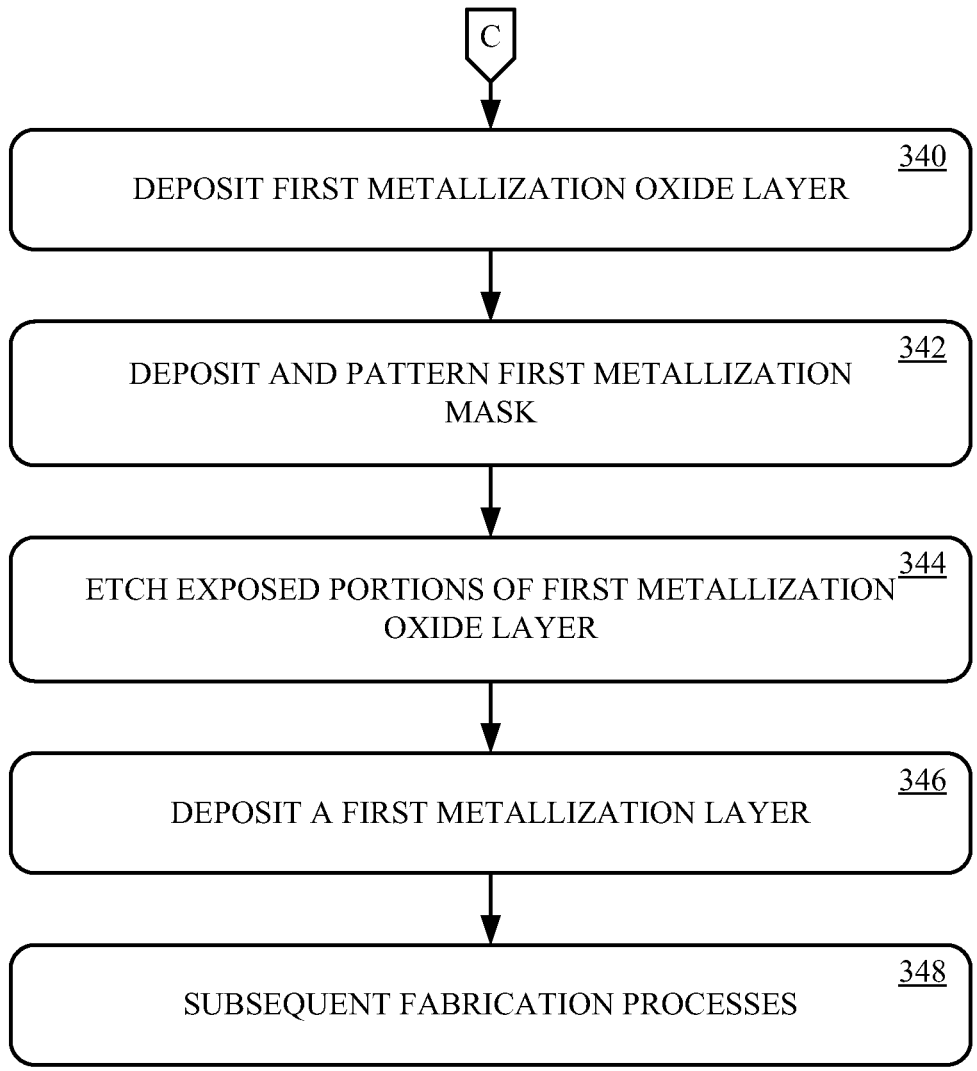

At 338, an etch stop layer (ESL) is deposited. Referring now to FIG. 3D, a first metallization oxide layer 440 is deposited, at 340. At 342, a photo-resist is deposited and patterned by any well-known lithography process to form a first metallization layer mask. At 344, the exposed portions of the first metallization oxide layer 440 are etched by any well-known isotropic etching method. At 346, a third metal layer is deposited using an additive plating technique or the like to form first metallization layer to make connections 446, 447 to the source vias 436 and the staggered bit line vias 437. In one implementation, the metal may be copper (Cu), aluminum (Al), tungsten (W) or the like. At 348, fabrication continues with various other processes. The various processes typically include cleaning, depositing, oxidation, doping, diffusion, implanting, photolithography, etching, chemical vapor deposition, evaporation, sputtering, epitaxy, annealing, passivation, cleaving and/or the like.

Referring now to FIGS. 5A-5D, a method of fabricating interconnects in an IC memory device, according to another embodiment of the present technology, is shown. The method of fabricating multilevel interconnects in the IC memory device will be further illustrated with reference to FIGS. 6A-6D, which shows various stages during fabrication of the IC memory device. Again, the left side of FIGS. 6A-6D illustrate a cross-sectional view of FIG. 2 along view line A-A and the right side of FIG. 6A-6D illustrate a cross-sectional view of FIG. 2 along view line B-B. The method of fabricating the IC memory device begins, at 502, with various initial processes upon a wafer 602, such as cleaning, depositing, oxidation, doping, diffusion, implanting, photolithography, etching, chemical vapor deposition, evaporation, sputtering, epitaxy, annealing and/or the like. The initial fabrication processes form an array of memory cells, and periphery circuits such as input/output buffers, data latch, address latch, address decoders and control logic. In one implementation, the IC memory device may be a NAND flash memory device.

Figure 5A:
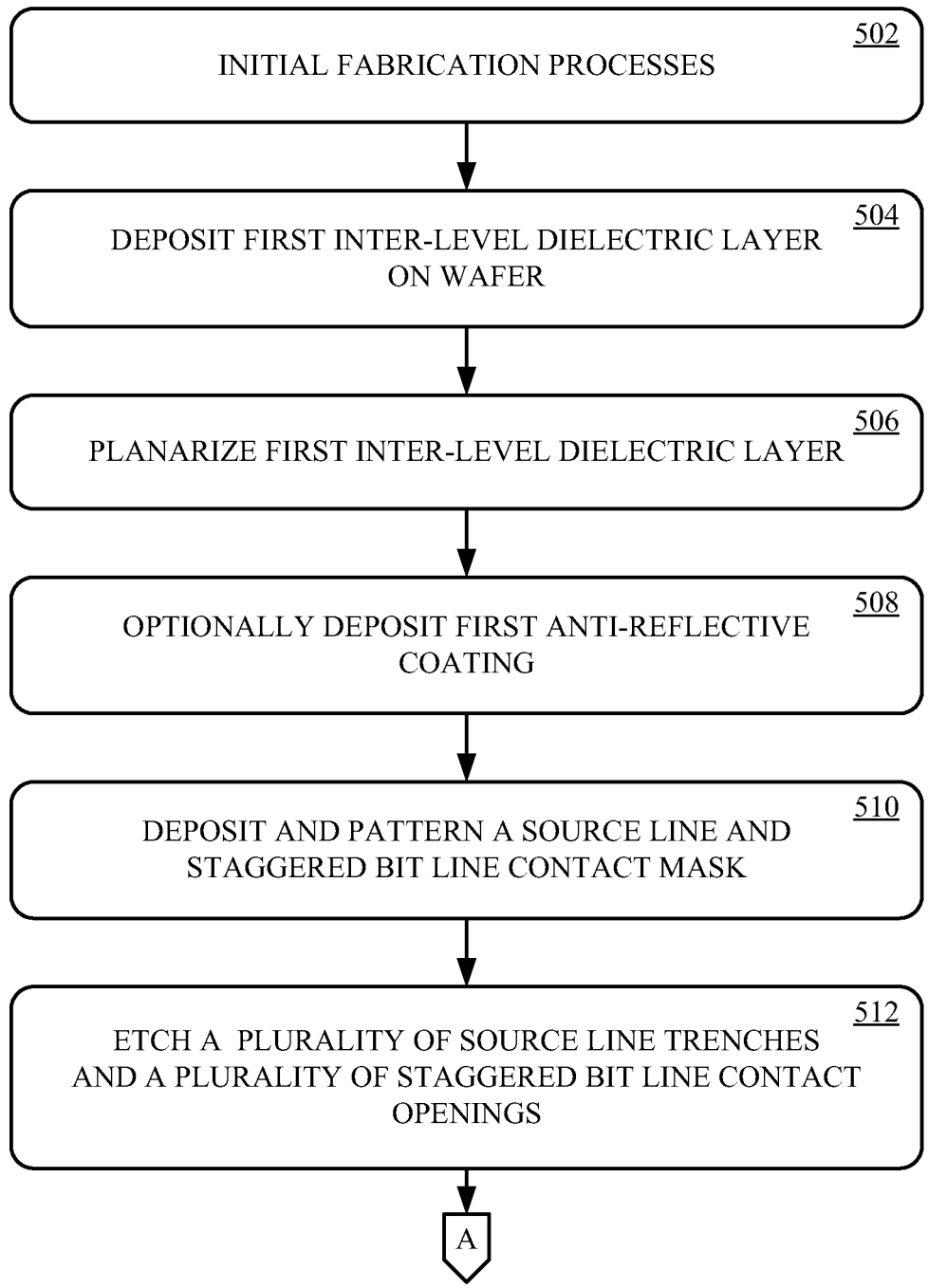
FIGS. 5A-5D show a method of fabricating interconnects in an integrated circuit (IC) memory device, according to another embodiment of the present technology.
Figure 5B:
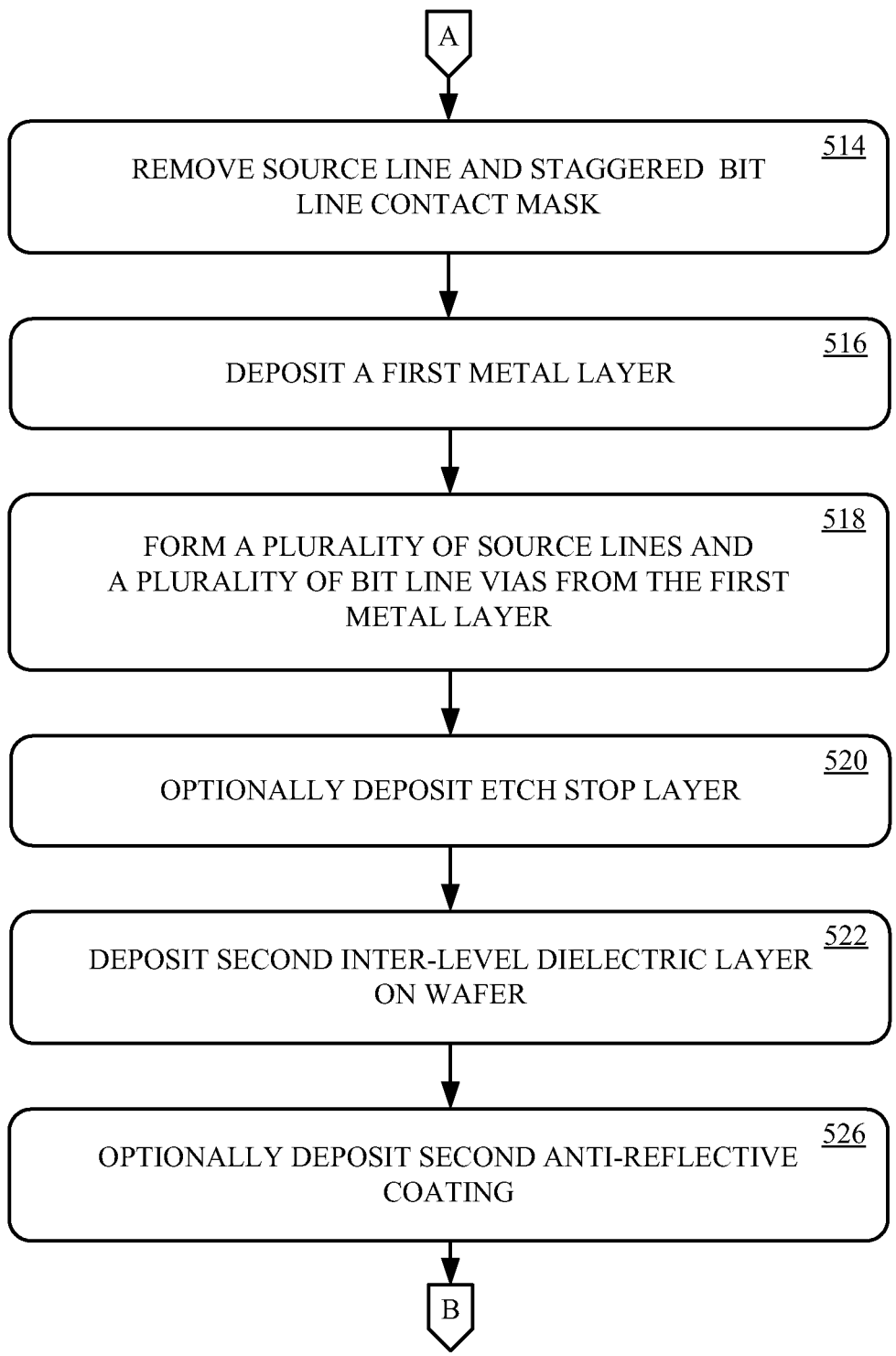

At 504, a first inter-level dielectric layer (ILD0A) 604 is deposited on the wafer 602. The inter-level dielectric may be chemical-vapor-deposited or sputtered silicon dioxide (SiO2), polyimide or the like. At 506, the inter-level dielectric layer 604 is thinned and/or planarized. In one implementation, the deposited first inter-level dielectric layer is thinned and planarized by chemical-mechanical polishing (CMP). At 508, an anti-reflective coating (ARC) 608 may also be deposited. At 510, a photo-resist is deposited and patterned by any well-known lithography process to form a source line and staggered bit line contact mask. At 512, a plurality of openings are etched by any well-known etching method to form a plurality of source line trenches 612 and a plurality of staggered bit line contact openings 613. In one implementation, an etchant interacts with the portions of the first inter-level dielectric layer 604 exposed by the patterned resist until a plurality of source line trenches 612 are formed that extend to the bit lines 615. The etchant also removes the exposed portions of the first inter-level dielectric layer 604 until a plurality of staggered bit line contact openings 613 are formed that extend to one or more bit lines 615. The bit line contact openings 613 are staggered so that adjacent openings are not in the same row. In addition, the aspect ratio of the staggered bit line contact openings result in tapered walls. The staggering of the bit line contact openings enable use of a larger tapering for the bit line contact openings. Referring now to FIG. 5B, the source line and staggered bit line contact mask is removed utilizing an appropriate resist stripper or a resist ashing process, at 514.

Figure 6A:
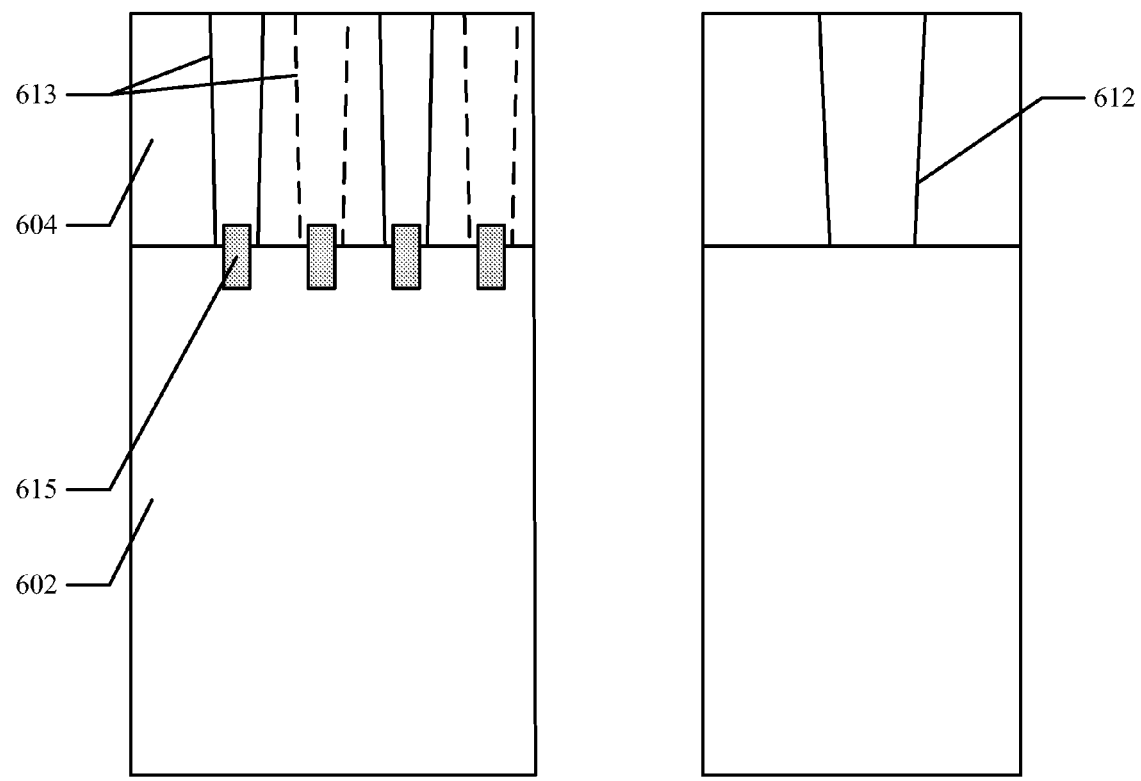
FIGS. 6A-6D shows various stages during fabrication of the IC memory device, in accordance with another embodiment of the present technology.
Figure 6B:
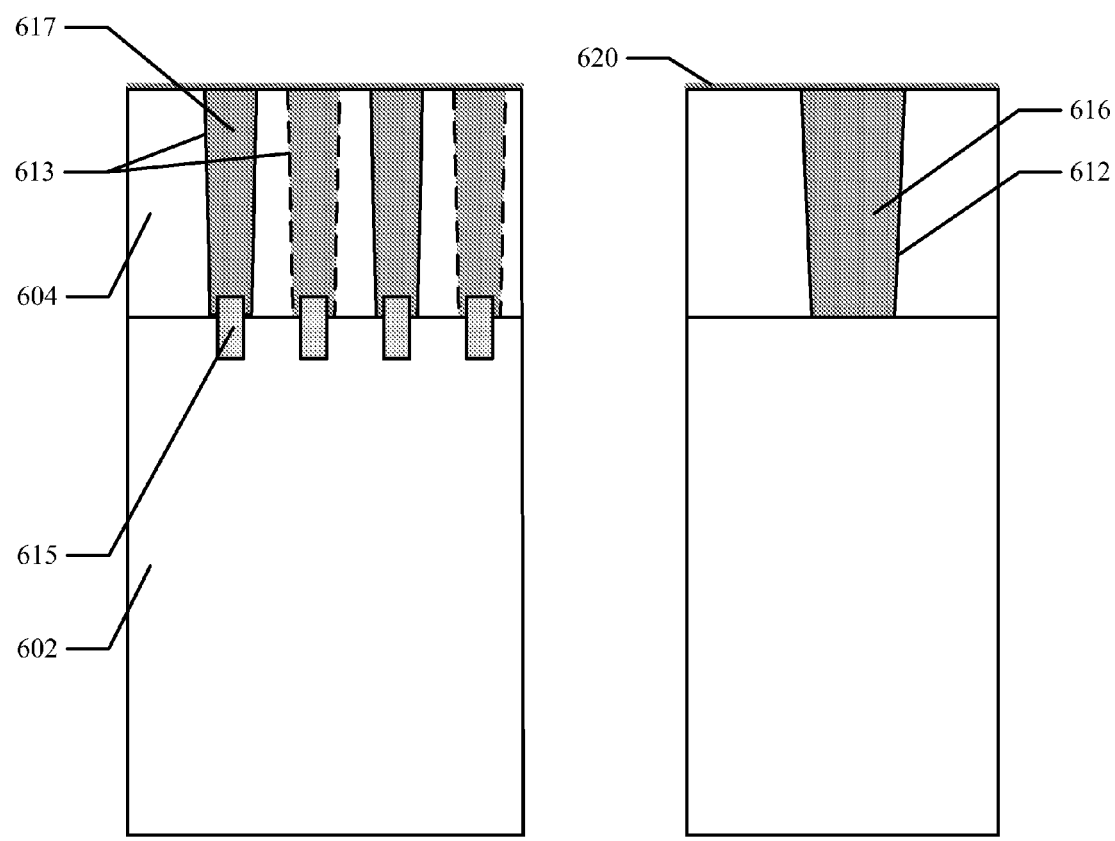

Referring now to FIG. 6B, a first metal layer is deposited on the first inter-level dielectric, at 516. In one implementation, the metal may be titanium (Ti), titanium nitride (TiN), tungsten (W), or a multilayer metal such as Ti/TiN/W. At 518, excess metal of the first metal layer is removed to form a plurality of source lines 616 in the source line trenches 612. Removal of the excess metal of the first metal layer also forms a plurality of bit line contacts 617 in the staggered bit line contact openings 613. In one implementation, the first metal layer is chemical-mechanical polished (CMP) to form the source lines 616 and the staggered bit line contacts 617. At 520, an etch stop layer (ESL) 620 may be deposited.

Figure 5C:
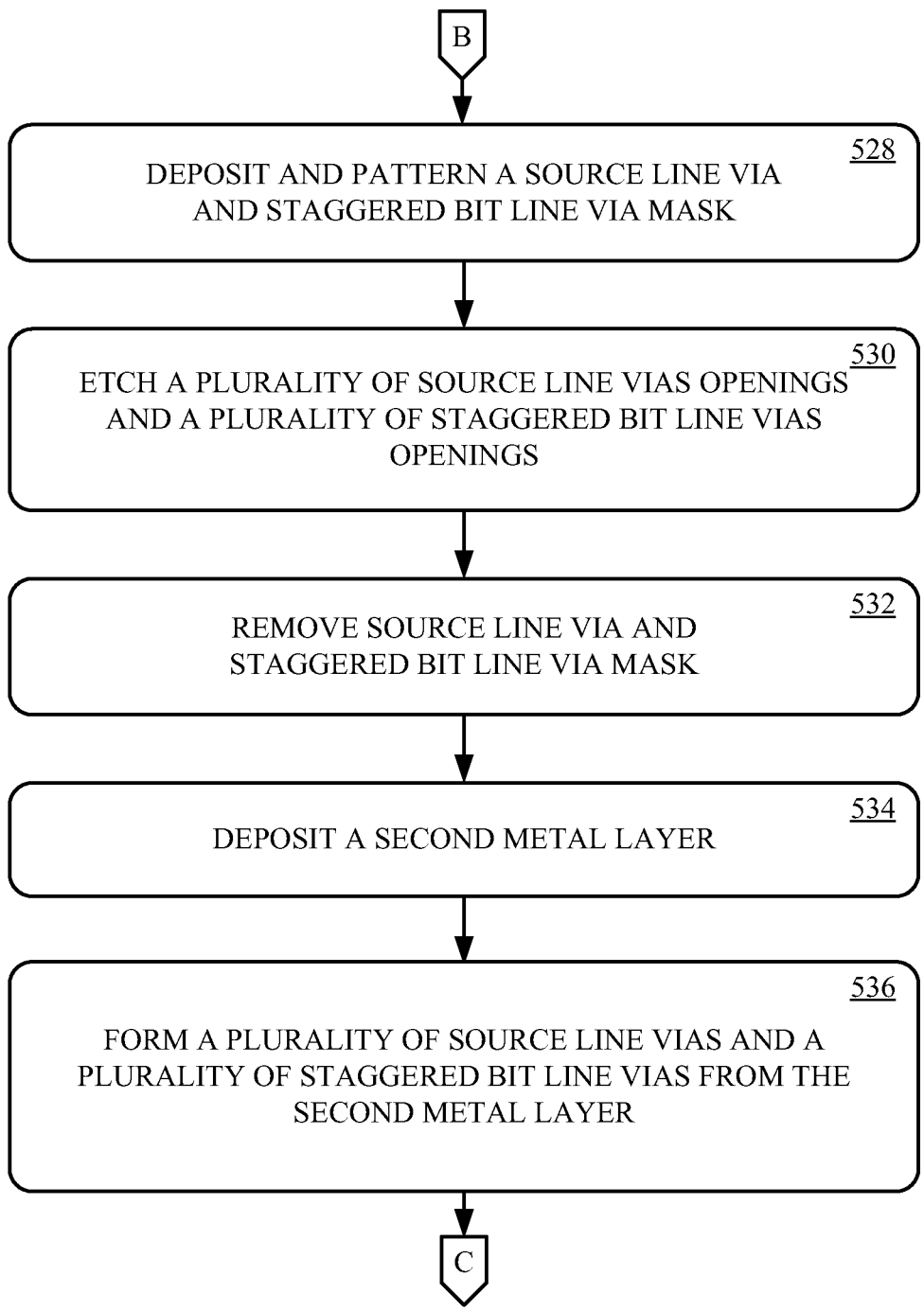
Figure 6C:
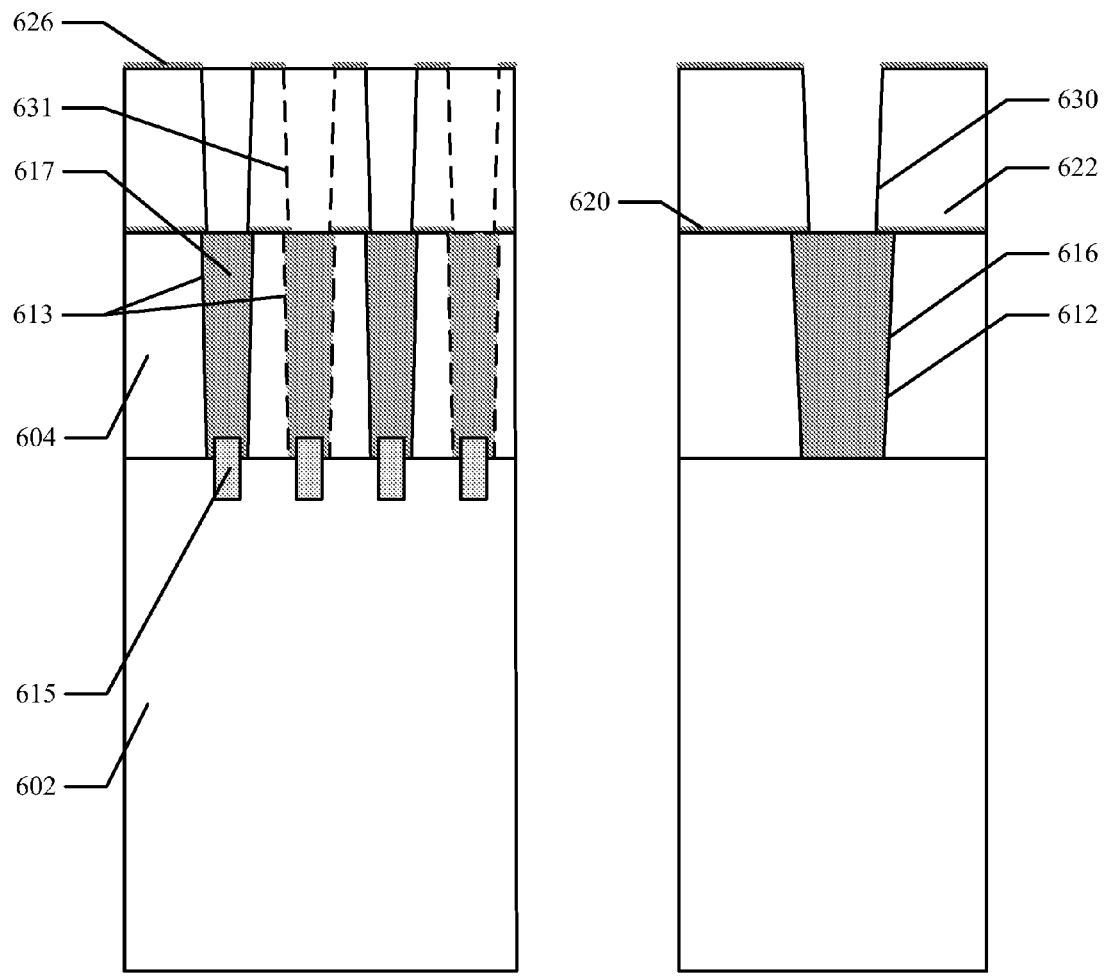

Referring now to FIG. 6C, a second inter-level dielectric layer (ILD0B) 622 is deposited, at 522. The inter-level dielectric may be chemical-vapor-deposited or sputtered silicon dioxide (SiO2), polyimide or the like. At 526, a second anti-reflective coating (ARC) 626 may also be deposited. Referring now to FIG. 5C, a photo-resist is deposited and patterned by any well-known lithography process to form a source line via and staggered bit line via mask, at 528. At 530, a plurality of openings are etched by any well-known etching method to form a plurality of source line via openings 630 and a plurality of staggered bit line via openings 631. In one implementation, an etchant removes the exposed portions of the second inter-level dielectric layer 622 exposed by the patterned resist layer until a plurality of openings extend to the source lines 616 and the staggered bit line contacts 617. Again, the aspect ratio of the staggered bit line via openings 631 result in tapered walls. The staggering of the bit line via openings enable use of a larger tapering for the bit line via openings.

Figure 6D:
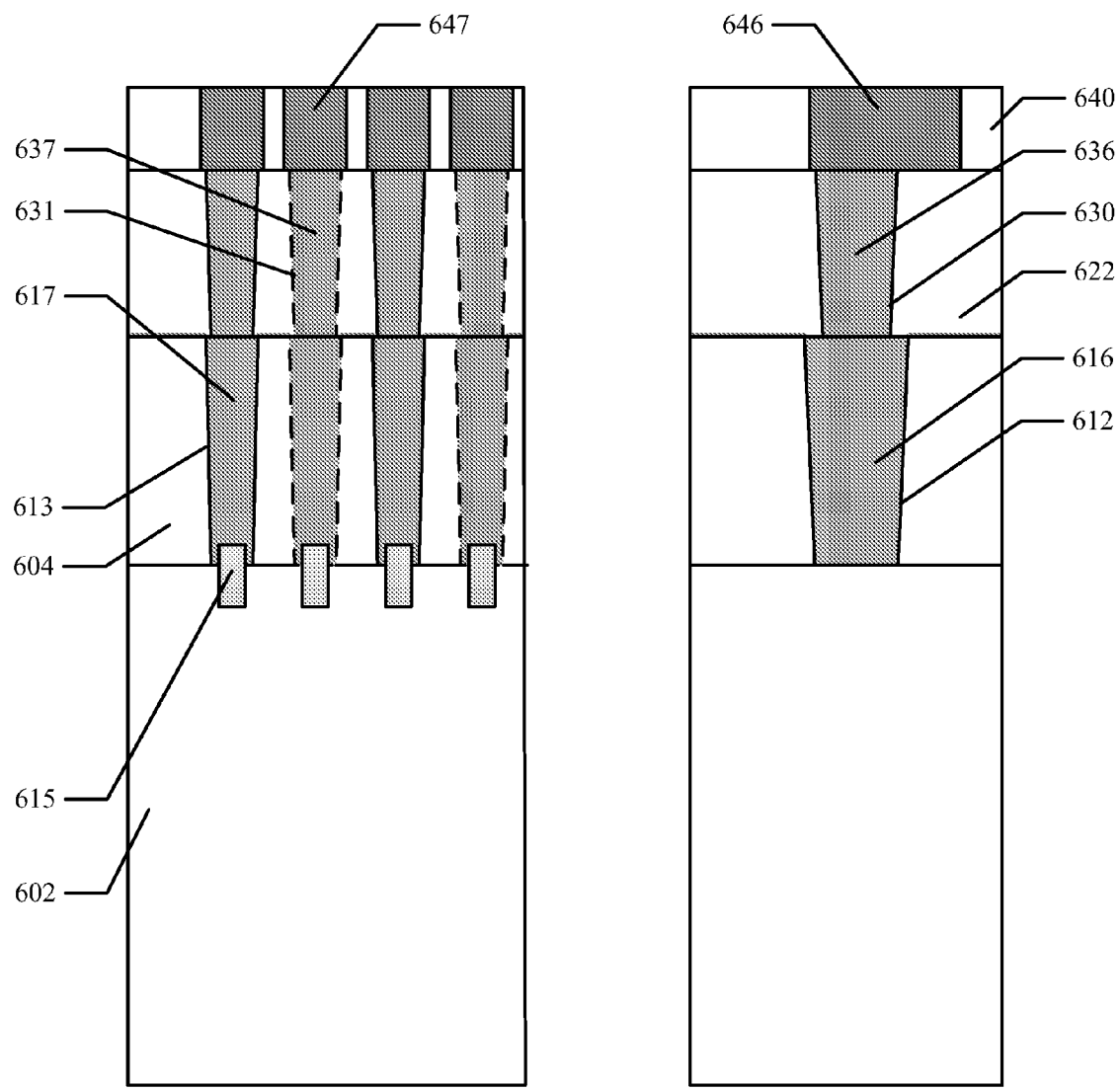

At 532, the source line via and staggered bit line via mask is removed utilizing an appropriate resist stripper or a resist ashing process. Referring now to FIG. 6D, a second metal layer is deposited on the second inter-level dielectric 622 and in the openings 630, 631, at 534. In one implementation, the metal may be titanium (Ti), titanium nitride (TiN), tungsten (W), or a multilayer metal such as Ti/TiN/W. At 536, excess metal is removed to form source line vias 636 and staggered bit line vias 637. In one implementation, the second metal layer is chemical-mechanical polished (CMP) to form the source line vias 636 in the source line via openings 630 and the plurality of staggered bit line vias 637 in the staggered bit line via openings 631. The resulting bit line vias are staggered so that adjacent bit line vias are not in the same row.

Figure 5D:
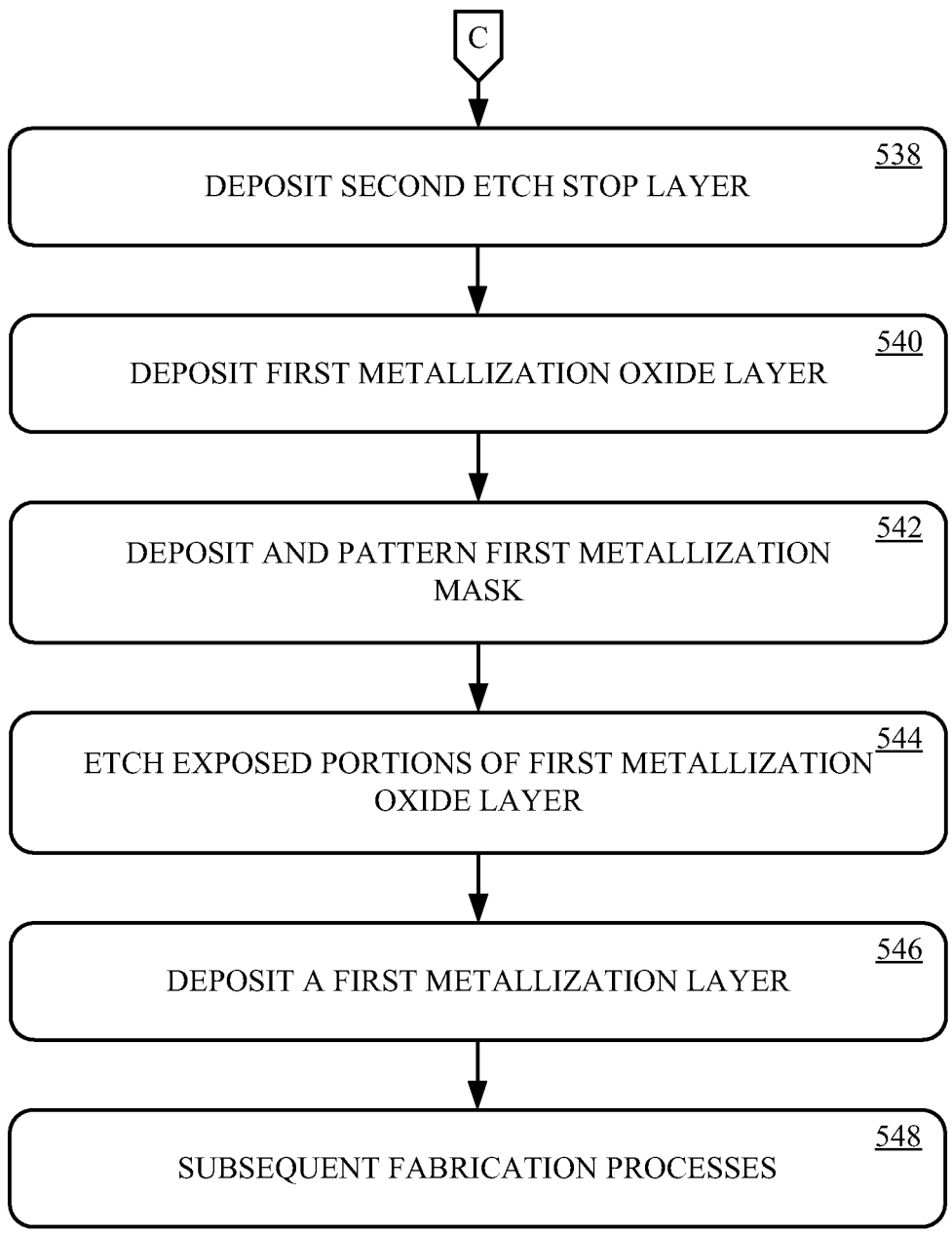

Referring now to FIG. 5D, a second etch stop layer (ESL) may be deposited, at 538. At 540, a first metallization oxide layer 640 is deposited. At 542, a photo-resist is deposited and patterned by any well-known lithography process to form a first metallization layer mask. At 544, the exposed portions of the first metallization oxide layer 640 are etched by any well-known etching method. At 546, a third metal layer is deposited using an additive technique such as plating or the like to form a first metallization layer to make connects to the source line vias 646 and the bit line vias 647. In one implementation, the metal may be copper (Cu), aluminum (Al), tungsten (W) or the like. At 548, fabrication continues with various other processes. The various processes typically include cleaning, depositing, oxidation, doping, diffusion, implanting, photolithography, etching, chemical vapor deposition, evaporation, sputtering, epitaxy, annealing, passivation, cleaving and/or the like.

Figure 9A:
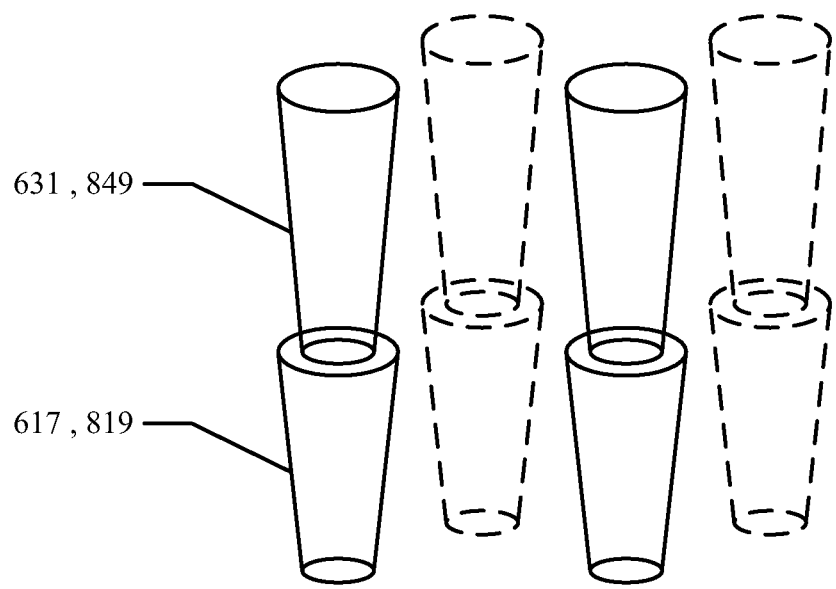
FIGS. 9A and 9B show staggered bit line vias and contracts, in accordance with embodiments of the present technology.
Figure 9B:
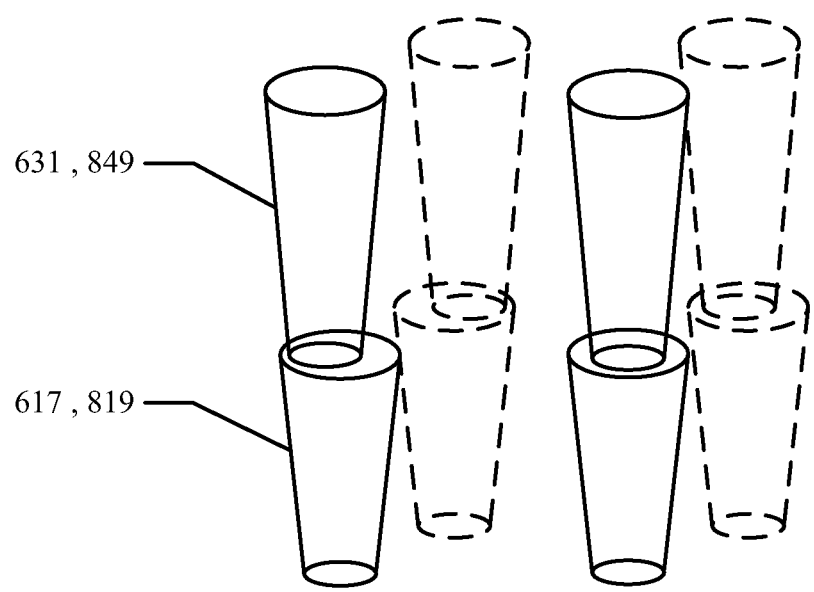

It is appreciated that the staggering of the bit line vias and the tapering of the bit line vias increase the allowable alignment errors (e.g., relaxes lithography constraints) between the staggered bit line contacts and staggered bit line vias respectively. For instance, as illustrated in FIGS. 9A and 9B, the combination of the tapering of the bit line vias and contacts and the staggering of the bit line vias and contacts relaxes the lithography constraints such that the vias and contacts maintain electrical contact with each other and do not overlap adjacent bit line vias and contacts even when there is a given amount misalignment between the bit line vias and contacts 617, 631. In addition, the tapering of the bit line vias and contacts 617, 631 and the source line and source line vias allow a more uniform metal fill.

Referring now to FIGS. 7A-7D, a method of fabricating interconnects in an IC memory device, according to another embodiment of the present technology, is shown. The method of fabricating multilevel interconnects in the IC memory device will be further illustrated with reference to FIGS. 8A-8D, which shows various stages during fabrication of the IC memory device. Again, the left side of FIGS. 8A-8D illustrate a cross-sectional view of FIG. 2 along view line A-A and the right side of FIG. 8A-8D illustrate a cross-sectional view of FIG. 2 along view line B-B. The method of fabricating the IC memory device begins, at 702, with various initial processes upon a wafer 802, such as cleaning, depositing, oxidation, doping, diffusion, implanting, photolithography, etching, chemical vapor deposition, evaporation, sputtering, epitaxy, annealing and/or the like. The initial fabrication processes form an array of memory cells, and periphery circuits such as input/output buffers, data latch, address latch, address decoders and control logic. In one implementation, the IC memory device may be a NAND flash memory device.

At 704, a first inter-level dielectric layer (ILDOA) 804 is deposited on the wafer 802. The inter-level dielectric may be chemical-vapor-deposited or sputtered silicon dioxide (SiO2), polyimide or the like. At 706, the inter-level dielectric layer 804 is thinned and/or planarized. In one implementation, the deposited first inter-level dielectric layer is thinned and planarized by chemical-mechanical polishing (CMP). At 708, an anti-reflective coating (ARC) 808 may also be deposited. At 710, a photo-resist is deposited and patterned by any well-known lithography process to form a source line and staggered bit line contact mask. At 712, a plurality of openings are etched by any well-known etching method to form a plurality of source line trenches 812 and a plurality of staggered bit line contact openings 813 in the first inter-level dielectric layer. In one implementation, an etchant interacts with the exposed portions of the first inter-level dielectric layer 804 exposed by the patterned resist until a plurality of source line trenches 812 are formed. The etchant also removes the portions of the first inter-level dielectric layer 804 until a plurality of staggered bit line contact openings 813 are formed that extend to each of one or more bit lines 815. The bit line contact openings 813 are staggered so that adjacent openings are not in the same row. In addition, the aspect ratio of the staggered bit line contact openings 813 and the etchant used result in tapered walls. The staggering of the bit line contacts openings enable use of a larger tapering for the bit line contact openings.

Figure 7A:
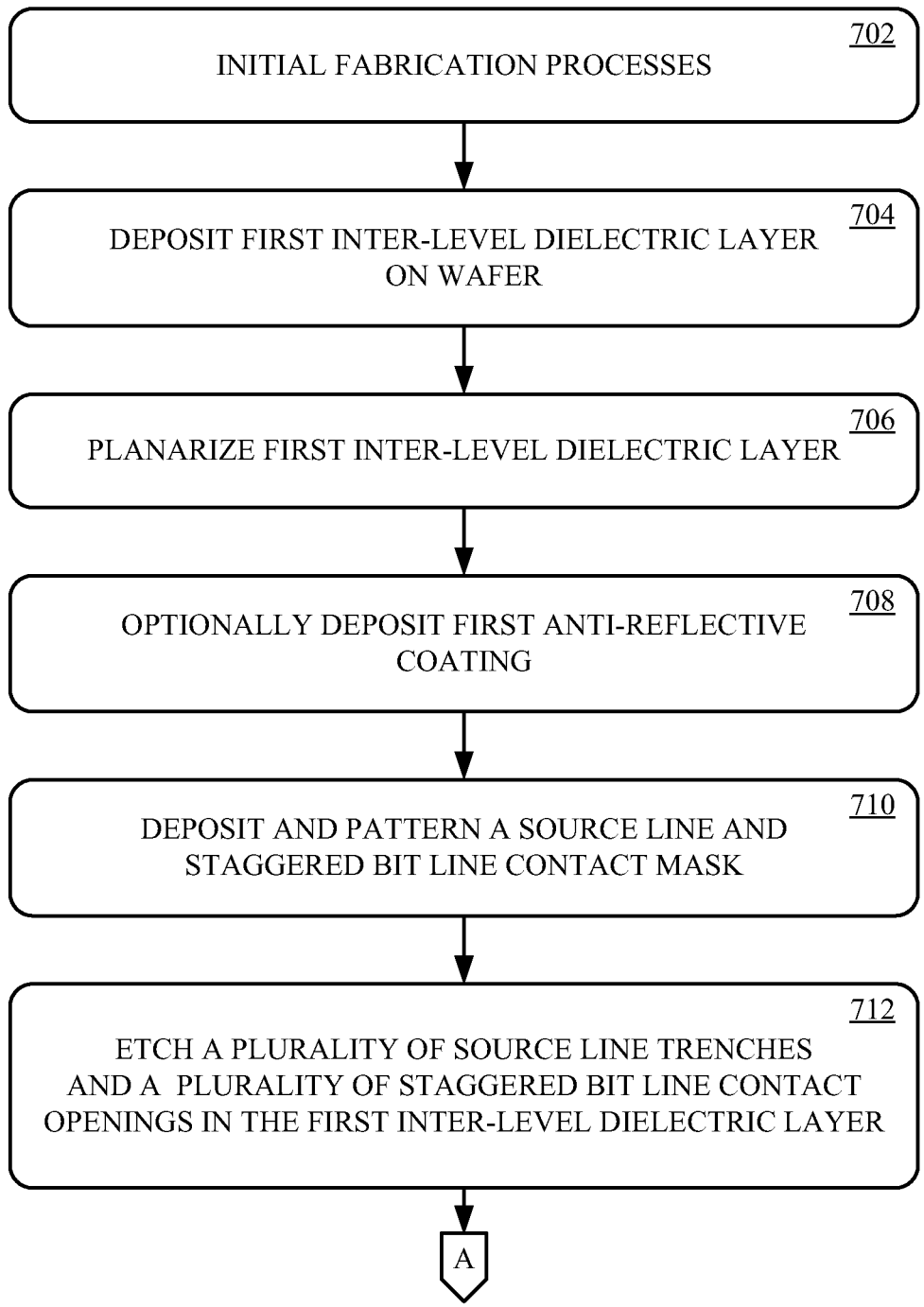
FIGS. 7A-7D show a method of fabricating interconnects in an integrated circuit (IC) memory device, according to yet another embodiment of the present technology.
Figure 7B:
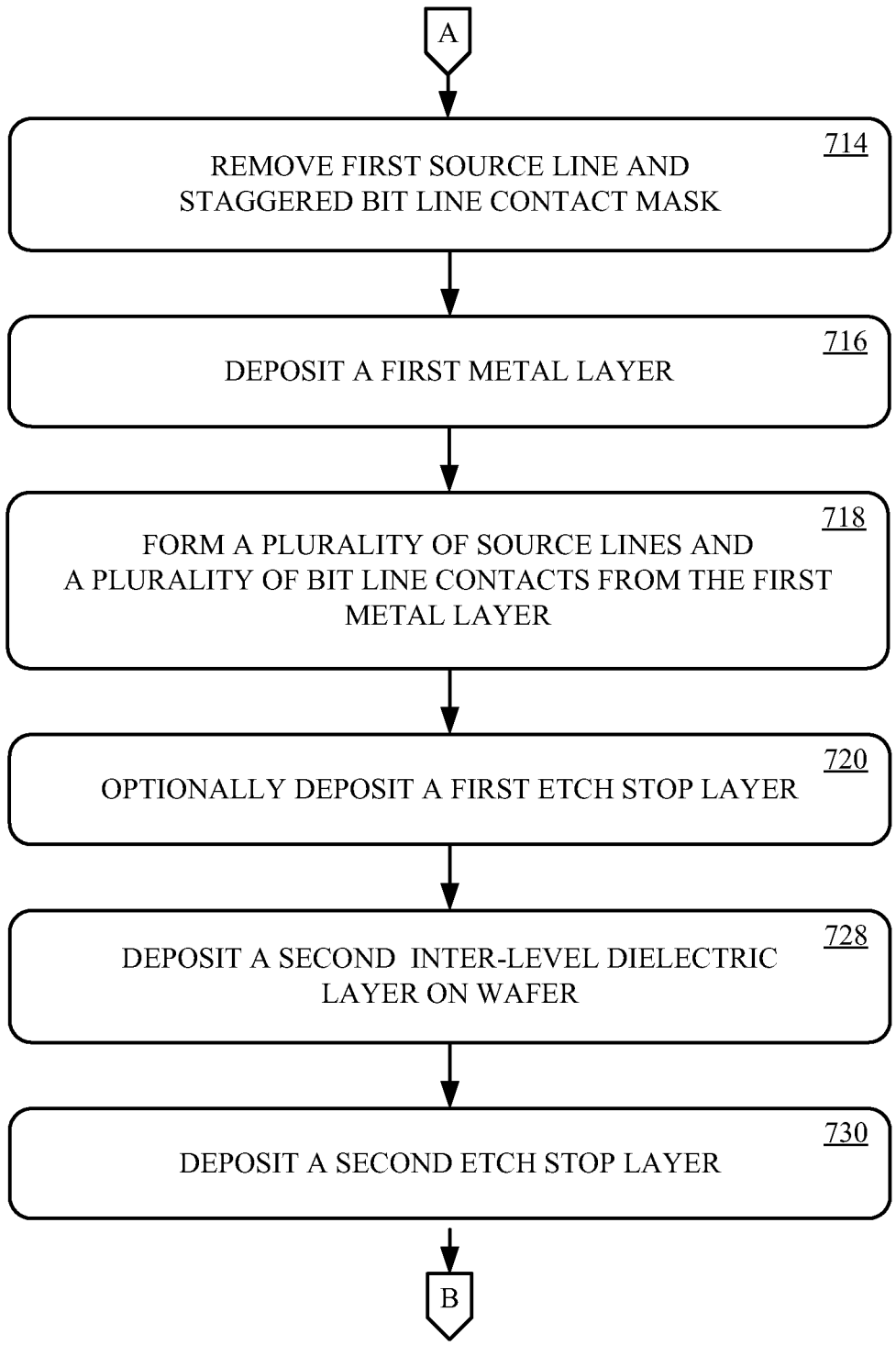
Figure 8A:
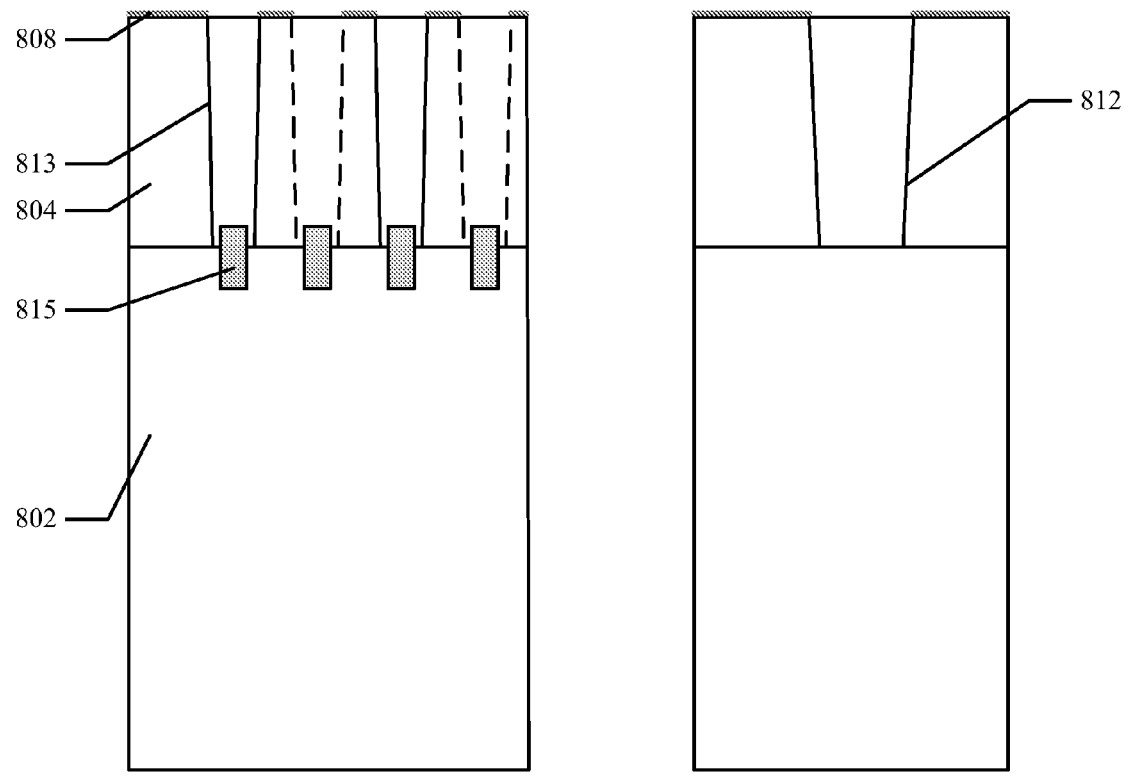
FIGS. 8A-8D shows various stages during fabrication of the IC memory device, in accordance with yet another embodiment of the present technology.
Figure 8B:
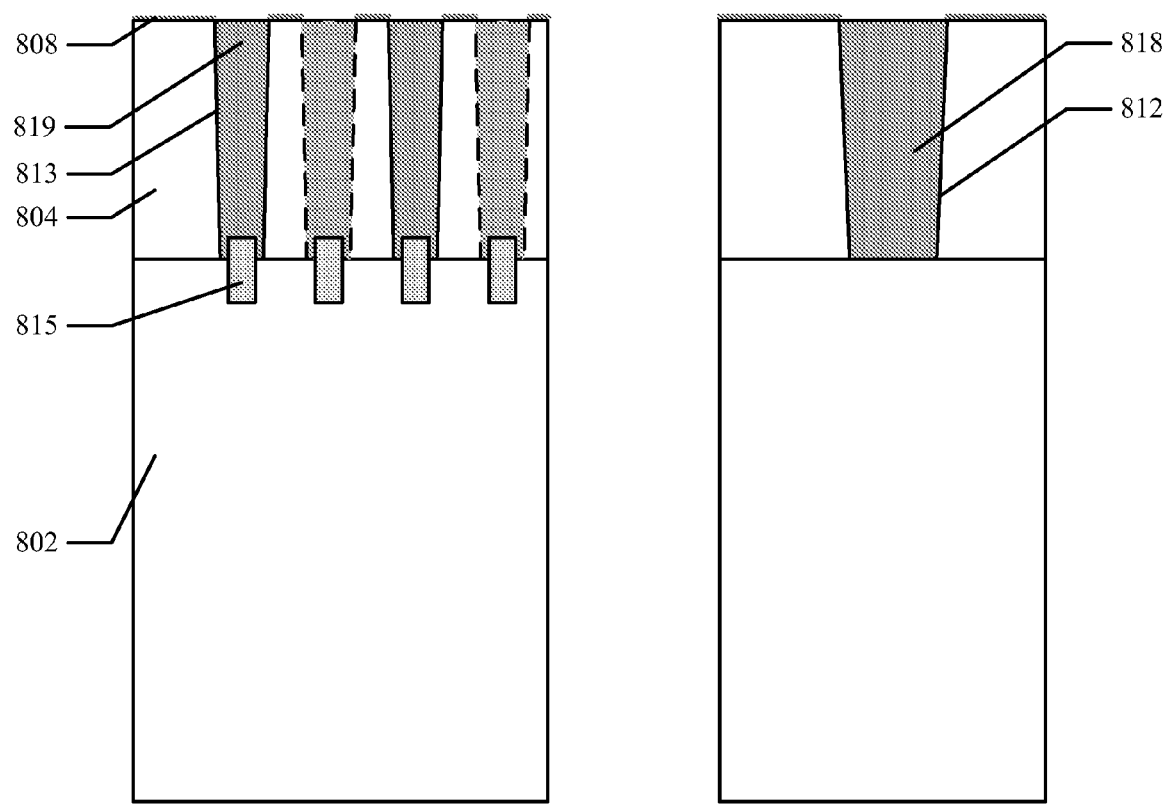

Referring now to FIG. 7B, the source line and staggered bit line contact mask is removed utilizing an appropriate resist stripper or a resist ashing process, at 714. A first metal layer is deposited on the first inter-level dielectric, at 716. In one implementation, the metal may be titanium (Ti), titanium nitride (TiN), tungsten (W), or a multilayer metal such as Ti/TiN/W. Referring now to FIG. 8B, excess metal of the first metal layer is removed to form source lines 818 in the plurality of source line trenches 812, at 718. Removal of the excess metal of the first metal layer also forms staggered bit line contacts 819 in the plurality of staggered bit line contact openings 813. In one implementation, the first metal layer is chemical-mechanical polished (CMP) to form the source lines 818 and staggered bit line contacts 819.

Figure 7C:
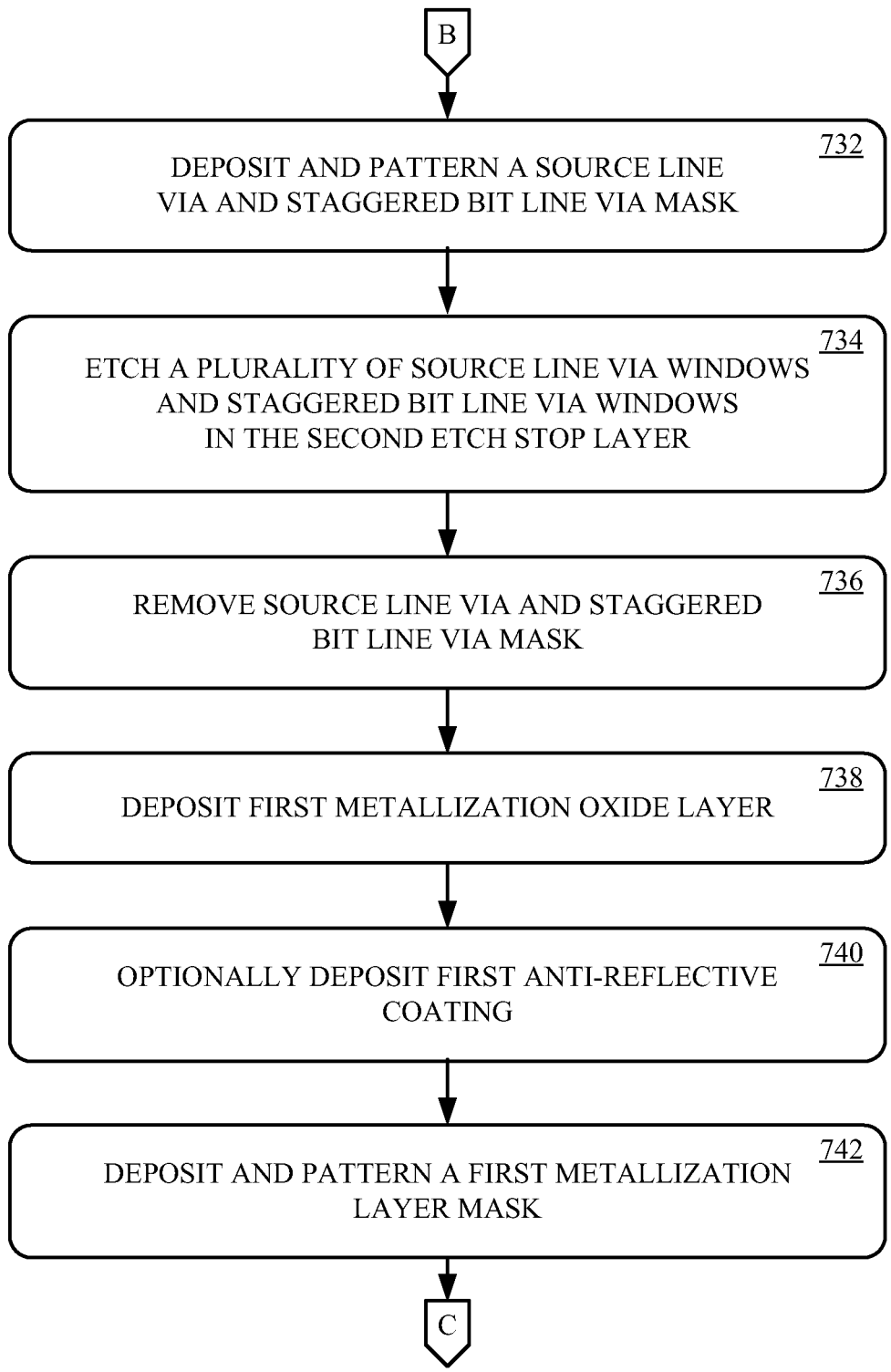
Figure 8C:
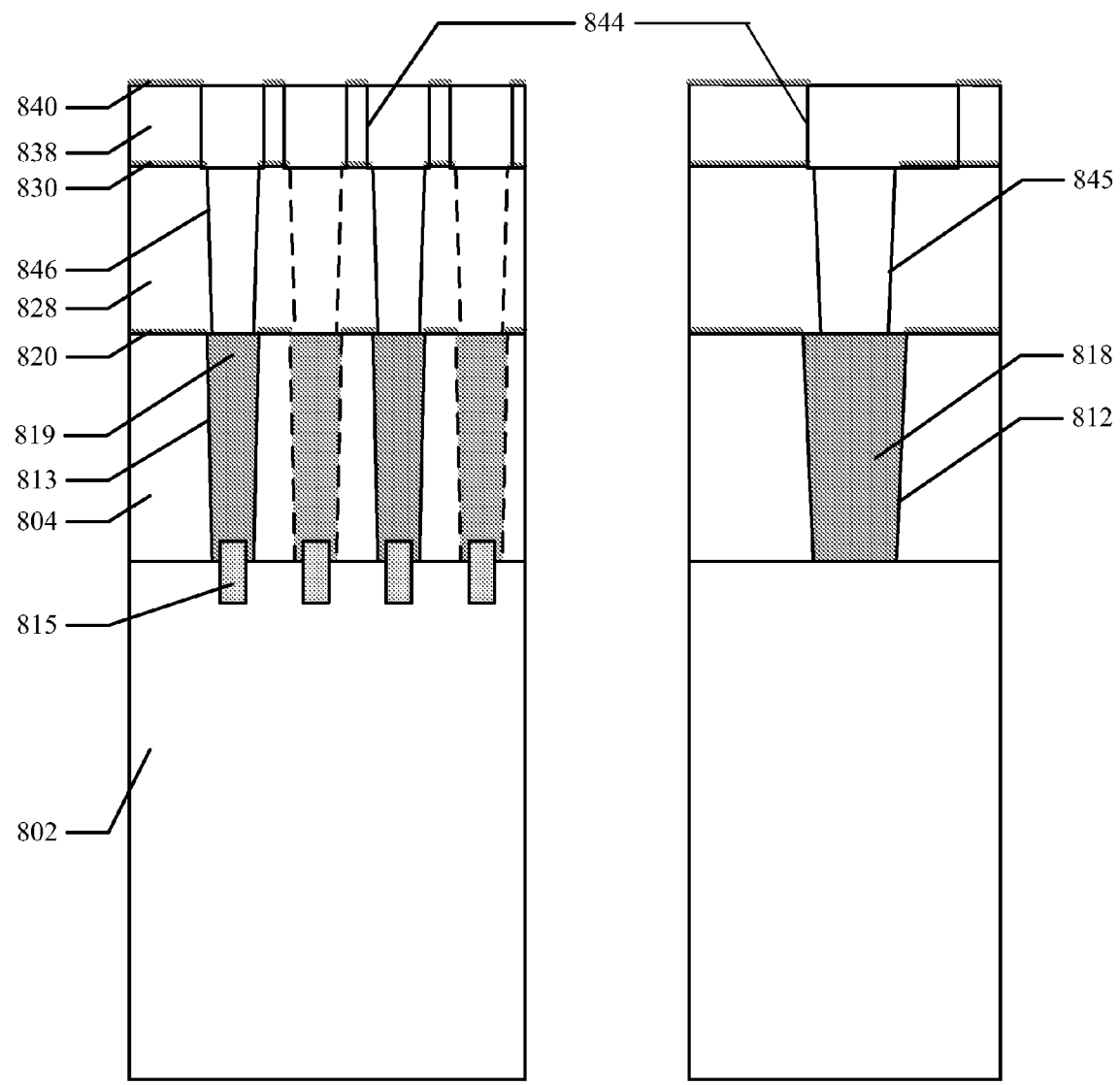
Figure 8D:
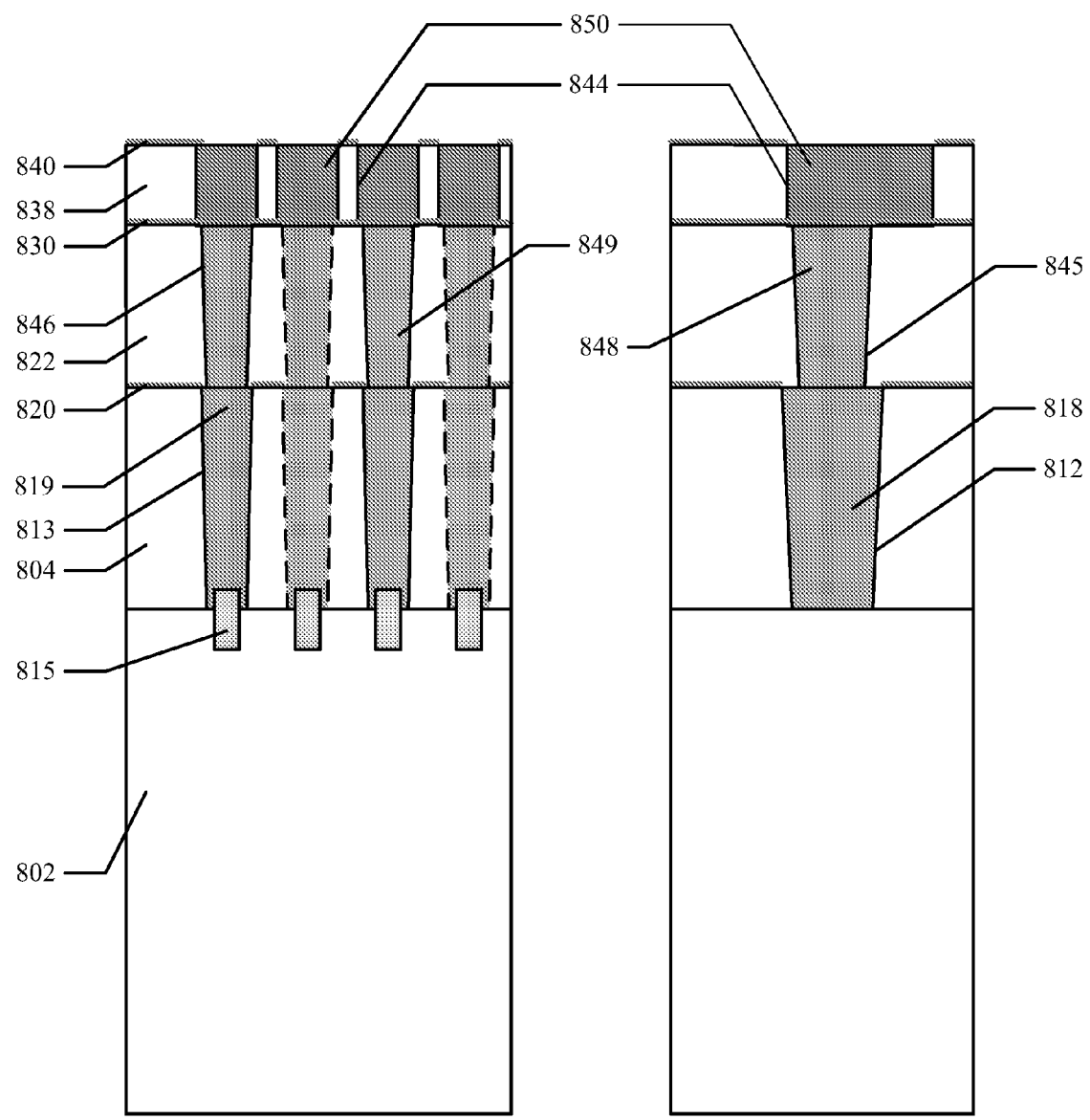

Referring now to FIG. 8C, a first etch stop layer (ESL) 820 may be deposited, at 720. In one implementation, the first ESL 820 may be a nitride layer, or the like. At 728, a second inter-level dielectric layer (ILD0B) 828 is deposited. The inter-level dielectric may be chemical-vapor-deposited or sputtered silicon dioxide (SiO2), polyimide or the like. At 730, a second ESL 830 is deposited. In one implementation, the second ESL 830 may be a nitride layer, or the liked. Referring now to FIG. 7C, a photo-resist is deposited and patterned by any well-known lithography process to form a source line via and staggered bit line via mask, at 732. At 734, a plurality of openings are etched in the second ESL 830 by any well-known etching method to form source line via windows and staggered bit line via windows in the second ESL 830. In one implementation, an etchant interacts with the exposed portions of second ESL 830 exposed by the patterned resist until a plurality of source line via and staggered bit line via windows are formed. At 736, the source line via and staggered bit line via mask is removed utilizing an appropriate resist stripper or a resist ashing process.

Figure 7D:
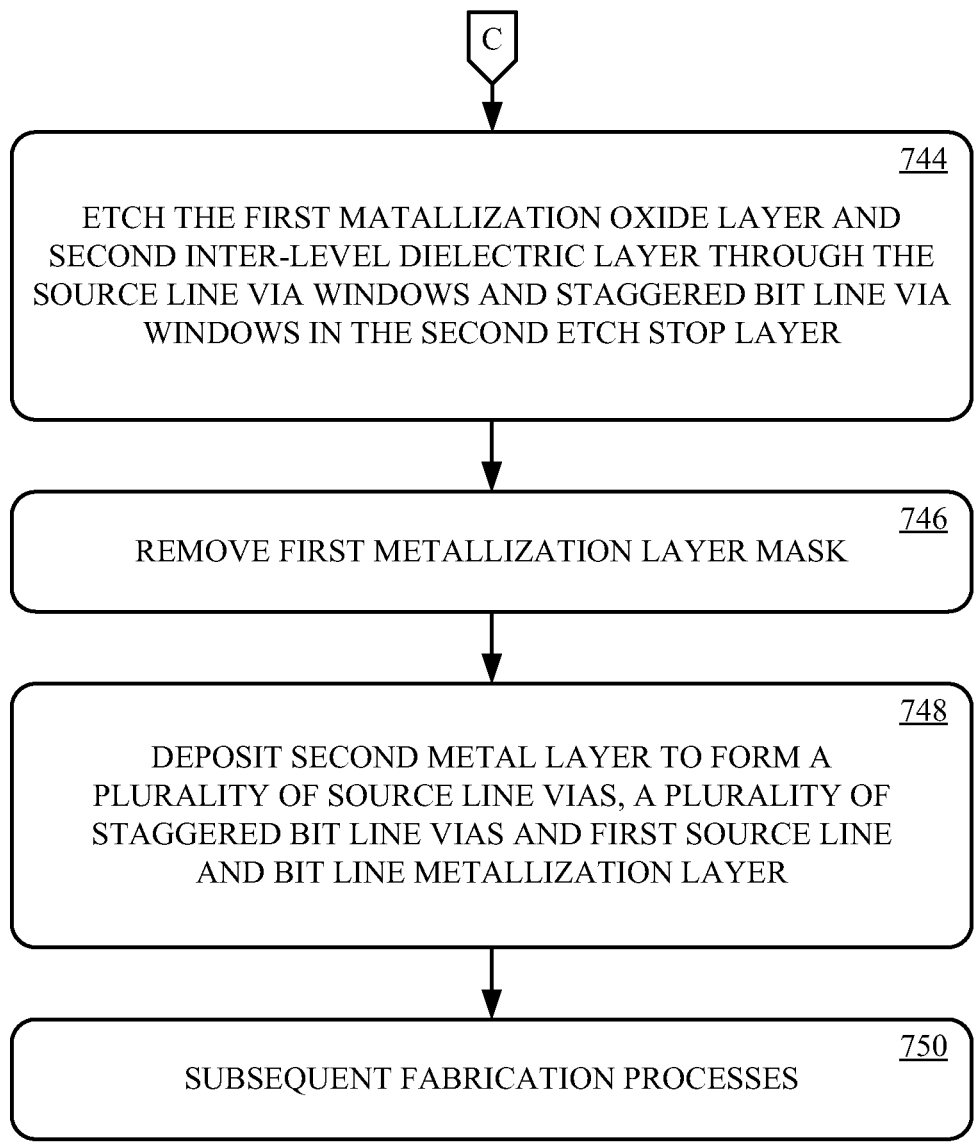

At 738, a first metallization oxide layer 838 is deposited. A second anti-reflective coating (ARC) 840 may also be deposited, at 740. At 742, a photo-resist is deposited and patterned by any well-known lithography process to form a first metallization layer mask. Referring now to FIG. 7D, the first metallization oxide layer 838 is etched by any well-known etching method to pattern a first source line and staggered bit line metal layer 844 in the first metallization oxide layer 838, at 744. In addition, the etchant interacts with the second inter-level dielectric layer (ILD0B) 838 through the source line via windows and staggered bit line via windows in the second ESL 830 to form source line via openings 845 and staggered bit line via openings 846 in the second inter-level dielectric layer 822. In one implementation, an etchant interacts with the portions of the first metallization oxide layer 838 to patterns the first metallization layer and then the second inter-level dielectric layer 822 until the source line via openings 845 are formed that extend to the source line contacts 818. The etchant also removes the exposed portions of the second inter-level dielectric layer 822 until staggered bit line via openings 846 are formed that extend to the staggered bit line contacts 819. Again, the aspect ratio of the staggered bit line via openings 846 and the etchant used result in tapered walls. The staggering of the bit line via openings enable use of a larger tapering for the bit line via openings. At 746, the first metallization layer mask is removed utilizing an appropriate resist stripper or a resist ashing process.

At 748, a second metal layer 842 is deposited using an additive technique such as plating or the like. In one implementation, the metal may be copper (Cu), aluminum (Al), tungsten (W) or the like. In another implementation, the metal may be tungsten (W), titanium (Ti), titanium nitride (TiN), or a multilayer metal such as Ti/TiN/W. The second metal layer forms source line vias 848, staggered bit line vias 849 and the source line and bit line first metallization layer 850. The resulting bit line vias 819, 849 are staggered so that adjacent bit line vias are not in the same row. At 750, fabrication continues with various other processes. The various processes typically include cleaning, depositing, oxidation, doping, diffusion, ion implanting, photolithography, etching, chemical vapor deposition, evaporation, sputtering, epitaxy, annealing, passivation, cleaving and/or the like.

It is appreciated that the staggering of the bit line contacts and vias 819, 849 and the source line and source line vias 818, 848, and the tapering of the portions of the bit line contacts and vias 819, 849 and source line and source line vias 818, 848 increase the allowable alignment errors (e.g., relaxes lithography constraints) between the bit line vias and contacts 819, 849 and the source line and source line vias 818, 848 respectively. For instance, as illustrated in FIGS. 9A and 9B the staggering of the bit line vias and contacts 819, 849 relax the lithography constraints in that the bit line vias and contacts 819, 849 maintain electrical contact with each other and do not overlap adjacent bit line vias and contacts even when there is a given amount of misalignment between the bit line vias and contacts 819, 849. In addition, the tapering of the bit line vias and contacts 819, 849 and the source line and source line vias 818, 848 allow a more uniform metal fill.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the Claims appended hereto and their equivalents.

What is claimed is:

1. An integrated circuit memory device comprising:
   a substrate having a plurality of bit lines;
   a first inter-level dielectric layer disposed on the substrate and on the plurality of bit lines;
   a second inter-level dielectric layer disposed on the first inter-level dielectric layer;
   a plurality of source lines that extend through the first miter-level dielectric layer;
   a plurality of source line vias that extend through the second inter-level dielectric layer to each respective one of the plurality of source lines;
   a plurality of bit line contacts that extend through the first inter-level dielectric layer to each respective one of the plurality of bit lines, wherein the plurality of bit line contacts are staggered so that adjacent ones of the bit line contacts are not in a same row;
   a plurality of bit line vias that extend through the second inter-level dielectric layer to each one of the plurality of bit line contacts, wherein the plurality of bit line vias are staggered so that adjacent ones of the bit line vias are not in a same row; and
   a metallization layer coupled to one or more of the plurality of source line vias and one or more of the plurality of bit line vias.

2. The integrated circuit memory device of claim 1, wherein the plurality of bit line contacts and the plurality of source lines are formed from a first metal layer.

3. The integrated circuit memory device of claim 2, wherein the plurality of bit line vias and the plurality of source line vias are formed from a second metal layer.

4. The integrated circuit memory device of claim 1, wherein the plurality of bit line contacts, the plurality of bit line vias, the plurality of source lines and the plurality of source line vias are formed from a metal or metal alloy.

5. The integrated circuit memory device of claim 1, wherein the plurality of bit line contacts, the plurality of bit line vias, the plurality of source lines and the plurality of source line vias are comprised of one or more metals selected from the group consisting of tungsten, titanium, and titanium nitride.

6. The integrated circuit memory device of claim 1, wherein each of the plurality of bit line contacts and each of the plurality of bit line vias are tapered.

7. The integrated circuit memory device of claim 1, wherein each of the plurality of source lines and each of the plurality of source line vias are tapered.

8. A method of fabricating an integrated circuit memory device comprising:
   depositing a first inter-level dielectric layer on a substrate having a plurality of bit lines and one the plurality of bit lines;
   etching a plurality of source line trenches in the first inter-level dielectric layer and a plurality of staggered bit line contact openings in the first inter-level dielectric layer that each extend to a respective one of the plurality of bit lines;

forming a plurality of source lines in the plurality of source line trenches and a plurality of staggered bit line contacts in the plurality of staggered bit line contact openings from a first metal layer;

depositing a second inter-level dielectric layer on the first inter-level dielectric layer;

etching a plurality of source line via openings in the second inter-level dielectric layer that each extend to a respective one of the plurality of source lines and a plurality of staggered bit line via openings in the second inter-level dielectric layer that each extend to a respective one of the plurality of staggered bit line contacts; and forming a plurality of source line vias in the plurality of source line via openings and a plurality of staggered bit line vias in the plurality of staggered bit line via openings from a second metal layer.

9. The method according to claim 8, wherein forming the plurality of source lines and the plurality of staggered bit line contacts comprises:

depositing the first metal layer after etching the source line trenches and the staggered bit line contact openings; and removing a portion of the first metal layer until the first metal layer only remains in the source line trenches and the staggered bit line contact openings.

10. The method according to claim 8, wherein forming the plurality of source line vias and the plurality of staggered bit line vias comprises:

depositing the second metal layer after etching the source line via openings and the staggered bit line via openings; and removing a portion of the second metal layer until the second metal layer only remains in the source line via openings and staggered bit line via openings.

11. The method according to claim 8, wherein:

the source line trenches and the staggered bit line contact openings are etched using a first mask; and the source line via openings and the staggered bit line via openings are etched using a second mask.

12. The method according to claim 8, further comprising:

depositing a first metallization oxide layer on the second inter-level dielectric layer;

etching a plurality of trenches in the first metallization oxide layer that extend to a respective one of the plurality of source line vias and the plurality of staggered bit line vias; and forming a first metallization layer in the plurality of trenches.

13. The method according to claim 8, wherein each of the plurality of bit line contacts and each of the plurality of bit line vias are tapered.

14. A method of fabricating an integrated circuit memory device comprising:

depositing a first inter-level dielectric layer on a substrate having a plurality of bit lines and on the plurality of bit lines of the substrate;

etching a plurality of source line trenches in the first inter-level dielectric layer and a plurality of staggered bit line contact openings through the first inter-level dielectric layer to a respective one of the plurality of bit lines;

forming a plurality of source lines in the plurality of source line trenches and a plurality of staggered bit line contacts in the plurality of staggered bit line contact openings from a first metal layer;

depositing a second inter-level dielectric layer on the first inter-level dielectric layer;

depositing an etch stop layer on the first inter-level dielectric layer;

etching a plurality of source line via windows and a plurality of bit line via windows in the etch stop layer proximate the source lines and the staggered bit line contacts respectively;

depositing a first metallization oxide layer on the etch stop layer;

etching a plurality of trenches in the first metallization oxide layer that extend to a respective one of the plurality of source line vias windows and the plurality of staggered bit line vias windows in the etch stop layer, a plurality of the source line via openings through the second inter-level dielectric layer to a respective one of the plurality of the source lines, and a plurality of staggered bit line via openings through the second inter-level dielectric layer to a respective one of the plurality of staggered bit line contacts; and forming a plurality of source line vias in the plurality of source line via openings, a plurality of staggered bit line vias in the plurality of staggered bit line via openings and a first metallization layer in the plurality of trenches in the first metallization oxide layer from a second metal layer.

15. The method according to claim 14, wherein forming the plurality of source lines and the plurality of staggered bit line contacts comprises:

depositing the first metal layer after etching the source line trenches and the staggered bit line contact openings; and removing a portion of the first metal layer until the first metal layer only remains in the source line trenches and the staggered bit line contact openings.

16. The method according to claim 14, wherein forming the source line vias, the plurality of staggered bit line vias and the first metallization layer comprises depositing the second metal layer using an additive metal depositing technique.

17. The method according to claim 14, wherein the first metal layer is tungsten, titanium, titanium nitride or a multi-layer of titanium, titanium nitride and tungsten.

18. The method according to claim 14, wherein the second metal layer is tungsten, titanium, titanium nitride or a multi-layer of titanium, titanium nitride and tungsten.

19. The method according to claim 14, wherein each of the plurality of staggered bit line contacts and each of the plurality of staggered bit line vias are tapered.

* * * * *